United States Patent
Naito

(10) Patent No.: US 10,847,617 B2
(45) Date of Patent: Nov. 24, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/207,193

(22) Filed: Dec. 3, 2018

(65) Prior Publication Data

US 2019/0189750 A1 Jun. 20, 2019

(30) Foreign Application Priority Data

Dec. 14, 2017 (JP) .................................. 2017-240022
Sep. 18, 2018 (JP) .................................. 2018-173307

(51) Int. Cl.

| H01L 29/10 | (2006.01) |
| H01L 29/739 | (2006.01) |
| H01L 29/06 | (2006.01) |
| H01L 29/423 | (2006.01) |
| H01L 29/417 | (2006.01) |
| H01L 29/40 | (2006.01) |

(52) U.S. Cl.
CPC ...... *H01L 29/1083* (2013.01); *H01L 29/0623* (2013.01); *H01L 29/0696* (2013.01); *H01L 29/4238* (2013.01); *H01L 29/7397* (2013.01); *H01L 29/1095* (2013.01); *H01L 29/407* (2013.01); *H01L 29/41708* (2013.01)

(58) Field of Classification Search
CPC ............. H01L 29/1083; H01L 29/0623; H01L 29/4238; H01L 29/0696; H01L 29/7397; H01L 29/407; H01L 29/41708; H01L 29/1095

See application file for complete search history.

(56) References Cited

U.S. PATENT DOCUMENTS 6,285,060 B1 * 9/2001 Korec ................. H01L 29/1095
257/342
10,269,946 B2 4/2019 Matsuura
(Continued)

FOREIGN PATENT DOCUMENTS

JP 2004103980 A 4/2004
JP 2007311627 A 11/2007
(Continued)

*Primary Examiner* — Syed I Gheyas

(57) ABSTRACT

A semiconductor device is provided, including: a semiconductor substrate; a first-conductivity-type drift region provided in the semiconductor substrate; a gate trench portion extending in a predetermined extending direction in a plane of the upper surface of the semiconductor substrate; a mesa portion provided in contact with the gate trench portion in an array direction orthogonal to the extending direction; a first-conductivity-type accumulation region provided above the drift region and in contact with the gate trench portion, and having a higher doping concentration than the drift region; a second-conductivity-type base region provided above the accumulation region and in contact with the gate trench portion; and a second-conductivity-type floating region provided below the accumulation region and in contact with the gate trench portion, and provided in a part of the mesa portion in the array direction.

17 Claims, 28 Drawing Sheets

(56) References Cited

U.S. PATENT DOCUMENTS

| | | |
|---|---|---|
| 10,332,973 B2 | 6/2019 | Baburske |
| 10,651,301 B2 | 5/2020 | Kanda |
| 2007/0267663 A1 | 11/2007 | Harada |
| 2008/0197379 A1 | 8/2008 | Aono |
| 2009/0008674 A1* | 1/2009 | Udrea ............... H01L 29/0696 257/138 |
| 2011/0006362 A1* | 1/2011 | Hsieh ............... H01L 29/1095 257/330 |
| 2011/0201187 A1* | 8/2011 | Nishiwaki ........... H01L 29/0834 438/529 |
| 2012/0043581 A1* | 2/2012 | Koyama ............ H01L 29/0696 257/140 |
| 2012/0080718 A1* | 4/2012 | Soeno ............... H01L 27/0664 257/140 |
| 2015/0162407 A1 | 6/2015 | Laven |
| 2015/0221756 A1 | 8/2015 | Vellei |
| 2016/0204097 A1 | 7/2016 | Laven |
| 2016/0260710 A1 | 9/2016 | Okawara |
| 2017/0018637 A1 | 1/2017 | Kitamura |
| 2017/0025410 A1 | 1/2017 | Cheng |
| 2018/0286971 A1 | 10/2018 | Philippou |
| 2018/0350961 A1 | 12/2018 | Naito |
| 2019/0123185 A1 | 4/2019 | Vellei |
| 2019/0123186 A1 | 4/2019 | Philippou |
| 2019/0305083 A1 | 10/2019 | Dainese |
| 2019/0305087 A1 | 10/2019 | Philippou |

FOREIGN PATENT DOCUMENTS

| | | |
|---|---|---|
| JP | 2008078397 A | 4/2008 |
| JP | 2008205015 A | 9/2008 |
| JP | 2010114136 A | 5/2010 |
| JP | 2015135954 A | 7/2015 |
| JP | 2016164952 A | 9/2016 |
| JP | 2016225566 A | 12/2016 |
| JP | 2018037649 A | 3/2018 |
| JP | 2019012762 A | 1/2019 |
| WO | 2018030440 A1 | 2/2018 |

* cited by examiner

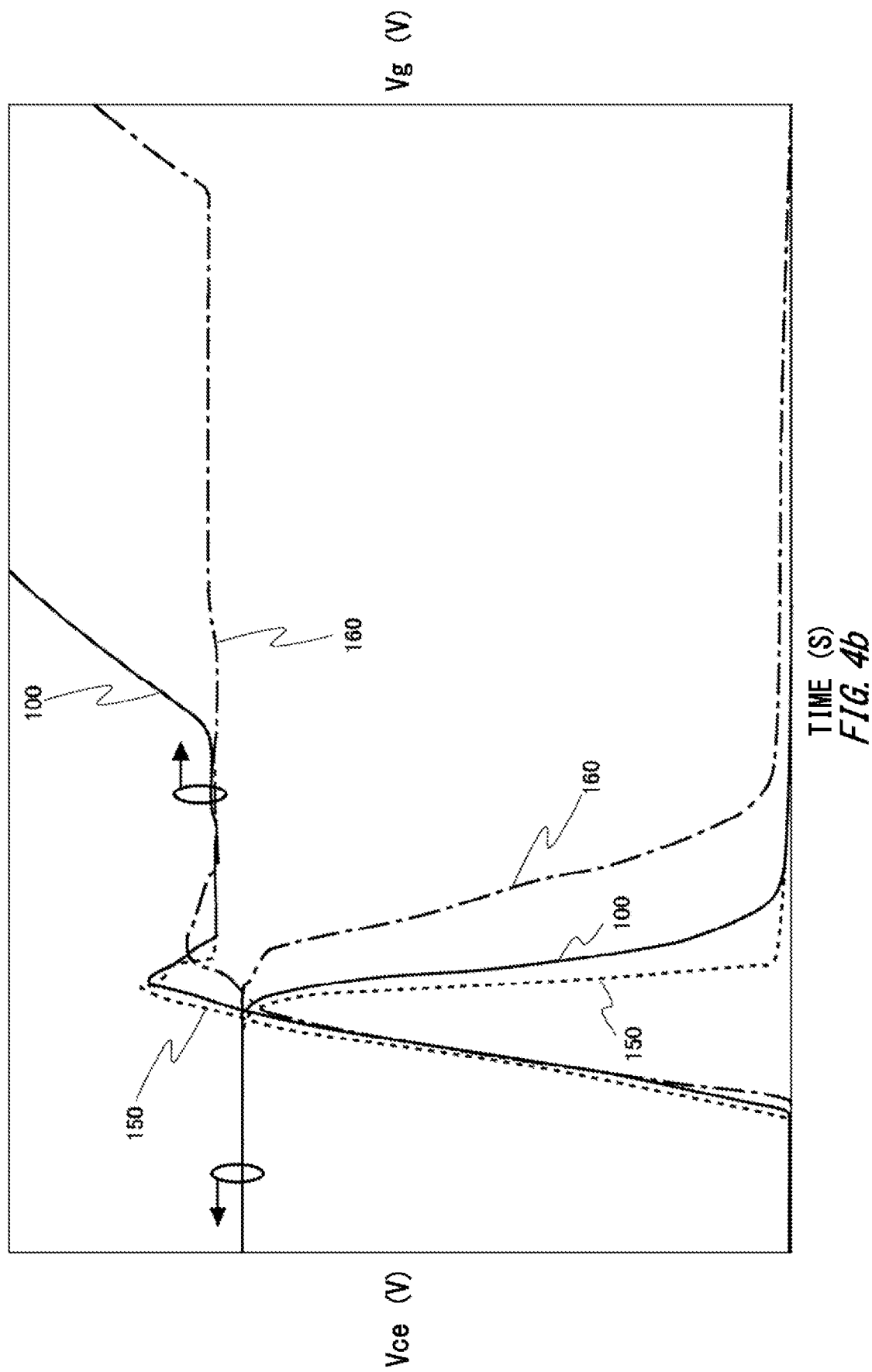

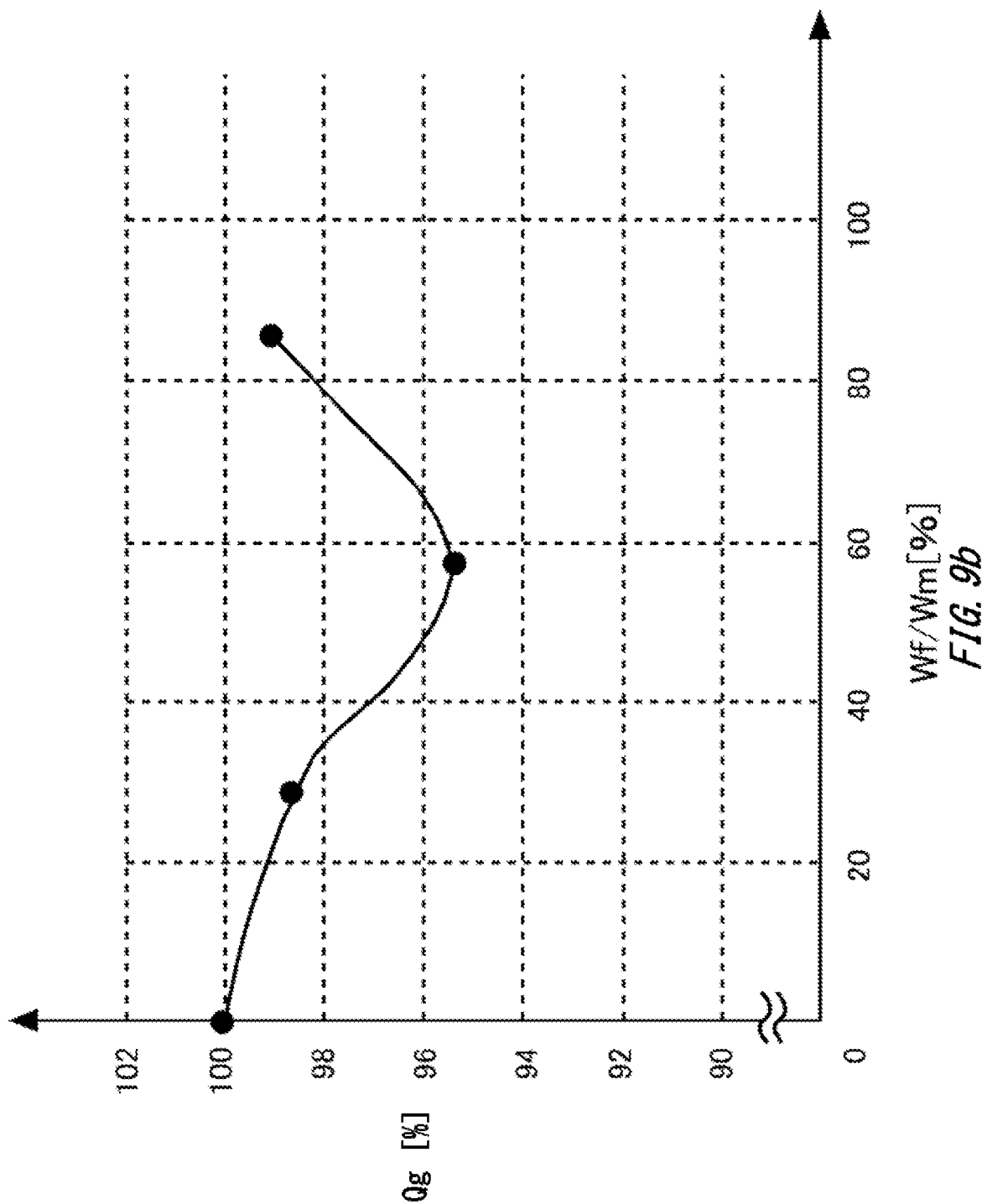

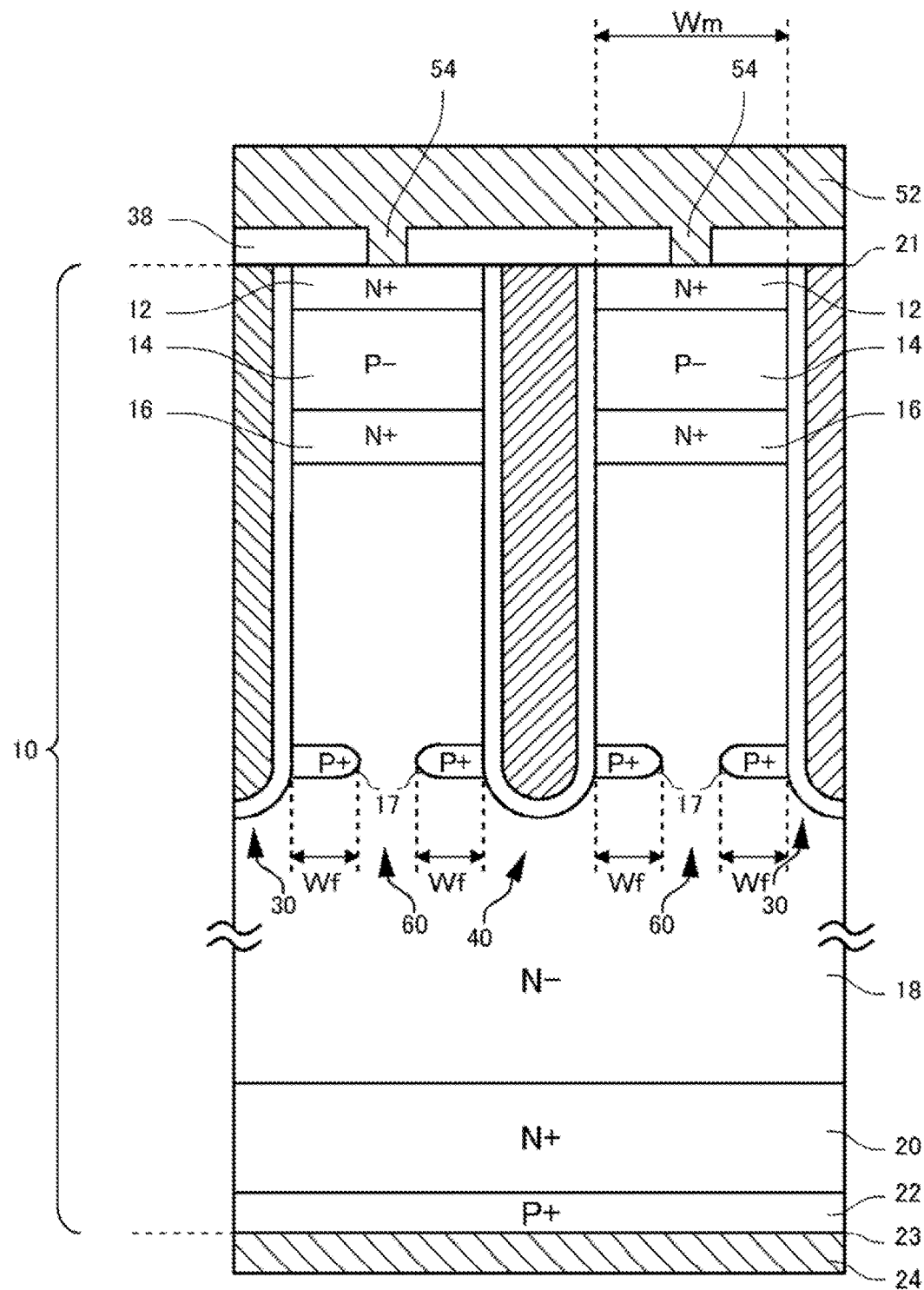

SEMICONDUCTOR DEVICE

The contents of the following Japanese patent application(s) are incorporated herein by reference:
NO. 2017-240022 filed in JP on Dec. 14, 2017 and
NO. 2018-173307 filed in JP on Sep. 18, 2018.

BACKGROUND

1. Technical Field

The present invention relates to a semiconductor device.

2. Related Art

Semiconductor devices such as insulated gate bipolar transistors (IGBTs) are conventionally known (see Patent Documents 1 and 2, for example).
Patent Document 1: Japanese Patent Application Publication No. 2004-103980
Patent Document 2: Japanese Patent Application Publication No. 2010-114136

It is preferable to reduce turn-on losses in semiconductor devices.

SUMMARY

A first aspect of the present invention provides a semiconductor device. The semiconductor device includes: a semiconductor substrate; a first-conductivity-type drift region provided in the semiconductor substrate; and a gate trench portion provided from an upper surface of the semiconductor substrate to an inside of the semiconductor substrate, and extending in a predetermined extending direction in a plane of the upper surface of the semiconductor substrate. The semiconductor device includes a mesa portion provided in contact with the gate trench portion in an array direction orthogonal to the extending direction. The semiconductor device includes one or more first-conductivity-type accumulation regions provided in the mesa portion above the drift region and in contact with the gate trench portion, and having a higher doping concentration than the drift region; a second-conductivity-type base region provided in the mesa portion above the accumulation regions and in contact with the gate trench portion; and a second-conductivity-type floating region provided in the mesa portion below the accumulation regions and in contact with the gate trench portion, and provided in a part of the mesa portion in the array direction.

The floating region may be spaced apart from the accumulation regions in a depth direction of the semiconductor substrate. At least a part of the floating region in the depth direction of the semiconductor substrate may be provided in contact with a bottom portion of the gate trench portion.

The semiconductor device may include a plurality of the accumulation regions arranged along a depth direction of the semiconductor substrate. One of the plurality of accumulation regions that is provided at a lowest position may have a lower doping concentration than one of the plurality of accumulation regions that is provided at an uppermost position.

A distance between the base region and the floating region in a depth direction of the semiconductor substrate may be larger than a width of the base region in the depth direction of the semiconductor substrate. A width of the floating region in the array direction may be between 0.1 times and 0.5 times, inclusive, of a width of the mesa portion in the array direction.

The drift region may be provided in a region of the mesa portion in direct contact with the floating region in the array direction. A width of the floating region in the array direction may be smaller than a width of the drift region in the array direction at a depth at which the floating region is provided.

The floating region may have a higher doping concentration than the accumulation regions. The doping concentration of the floating region may be $1 \times 10^{19}/cm^3$ or more.

The semiconductor device may further include a dummy trench portion provided from the upper surface of the semiconductor substrate to an inside of the semiconductor substrate, extending in the extending direction in the plane of the upper surface of the semiconductor substrate, and sandwiching the mesa portion with the gate trench portion; and a second-conductivity-type floating region provided in the mesa portion below the accumulation regions and in contact with the dummy trench portion, and provided in a part of the mesa portion in the array direction. The floating region contacting the gate trench portion and the floating region contacting the dummy trench portion may be spaced apart in the array direction.

A transistor section including the gate trench portion and a diode section may be provided in the semiconductor substrate. The diode section may include: the drift region; a dummy trench portion provided from the upper surface of the semiconductor substrate to an inside of the semiconductor substrate, and extending in the extending direction; a mesa portion provided in contact with the dummy trench portion in the array direction; and the base region provided in the mesa portion above the drift region and in contact with the dummy trench portion. No floating region may be provided for the dummy trench portion provided in the diode section.

A transistor section including the gate trench portion and a boundary section included in the transistor section may be provided in the semiconductor substrate. The boundary section may include: the drift region; a dummy trench portion provided from the upper surface of the semiconductor substrate to an inside of the semiconductor substrate, and extending in the extending direction; a mesa portion provided in contact with the dummy trench portion in the array direction; and the base region provided in the mesa portion above the drift region and in contact with the dummy trench portion. No floating region may be provided for the dummy trench portion provided in the boundary section.

A plurality of floating regions may be discretely arranged along the extending direction of the gate trench portion.

A first-conductivity-type emitter region having a higher doping concentration than the drift region and a second-conductivity-type contact region may be alternately arranged along the extending direction in a plane of an upper surface of the mesa portion contacting the gate trench portion. Each of the floating regions may be provided over a larger portion in the extending direction than the emitter region.

A second aspect of the present invention provides a semiconductor device. The semiconductor device includes: a semiconductor substrate; a first-conductivity-type drift region provided in the semiconductor substrate; and a gate trench portion provided from an upper surface of the semiconductor substrate to an inside of the semiconductor substrate, and extending in a predetermined extending direction in a plane of the upper surface of the semiconductor substrate. The semiconductor device includes a mesa portion provided in contact with the gate trench portion in an array direction orthogonal to the extending direction. The semiconductor device includes: a second-conductivity-type base region provided in the mesa portion above the drift region and in contact with the gate trench portion; and a second-conductivity-type floating region provided in the mesa portion below the base region and in contact with the gate trench portion, and provided in a part of the mesa portion in the array direction. In the semiconductor device, a distance between the base region and the floating region in a depth direction of the semiconductor substrate may be larger than a width of the base region in the depth direction of the semiconductor substrate.

The summary clause does not necessarily describe all necessary features of the embodiments of the present invention. The present invention may also be a sub-combination of the features described above.

BRIEF DESCRIPTION OF THE DRAWINGS

FIG. 1b shows an example of the cross section along a-a' in FIG. 1a.

FIG. 4a shows an example of the time waveforms of gate voltage Vg and CE voltage Vce during turn-on.

FIG. 4b is an enlarged view of transitioning waveforms of gate voltage Vg and CE voltage Vce in the time waveforms of FIG. 4a.

FIG. 5a shows an example of the cross section along b-b' in FIG. 1a.

FIG. 5b is an enlarged view of region A in FIG. 5a.

FIG. 7 shows an example of doping concentration distribution in the cross section along c-c' in FIG. 5a.

FIG. 9b shows an example of the relationship between the ratio of width Wf relative to width Wm (Wf/Wm) and charge Qg accumulated in the gate metal layer for the semiconductor device 100 according to the present example.

FIG. 12b shows an example of the cross section along e-e' in FIG. 12a.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side in a direction parallel to the depth direction of a semiconductor substrate is referred to as an "upper" side, and the other side is referred to as a "lower" side. One of two principal surfaces of a substrate, layer or another member is referred to as an upper surface, and the other is referred to as a lower surface. The directions toward the "upper" and "lower" sides are not limited by the direction of gravity or the direction in which an implemented semiconductor device is mounted on a substrate or the like.

In this specification, technical matters may be described using orthogonal coordinate axes of X-axis, Y-axis and Z-axis. In this specification, an X-Y plane is a plane parallel to the upper surface of a semiconductor substrate, and Z-axis is along the depth direction of the semiconductor substrate.

While each example embodiment shows a case where a first conductivity type is N-type and a second conductivity type is P-type, the first conductivity type may be P-type and the second conductivity type may be N-type. In that case, the respective conductivity types of substrates, layers, regions and the like in each example embodiment will be of the opposite polarity.

In this specification, doping concentration refers to the concentration of impurities acting as donors or acceptors. In this specification, doping concentration may refer to the difference in concentration of donors and acceptors. If the doping concentration distribution of a doped region has a peak, the value of the peak may be used as the doping concentration of the doped region. If the doping concentration of a doped region is approximately uniform, or the like, an average value of the doping concentration of the doped region may be used as the doping concentration.

Figure 1A:
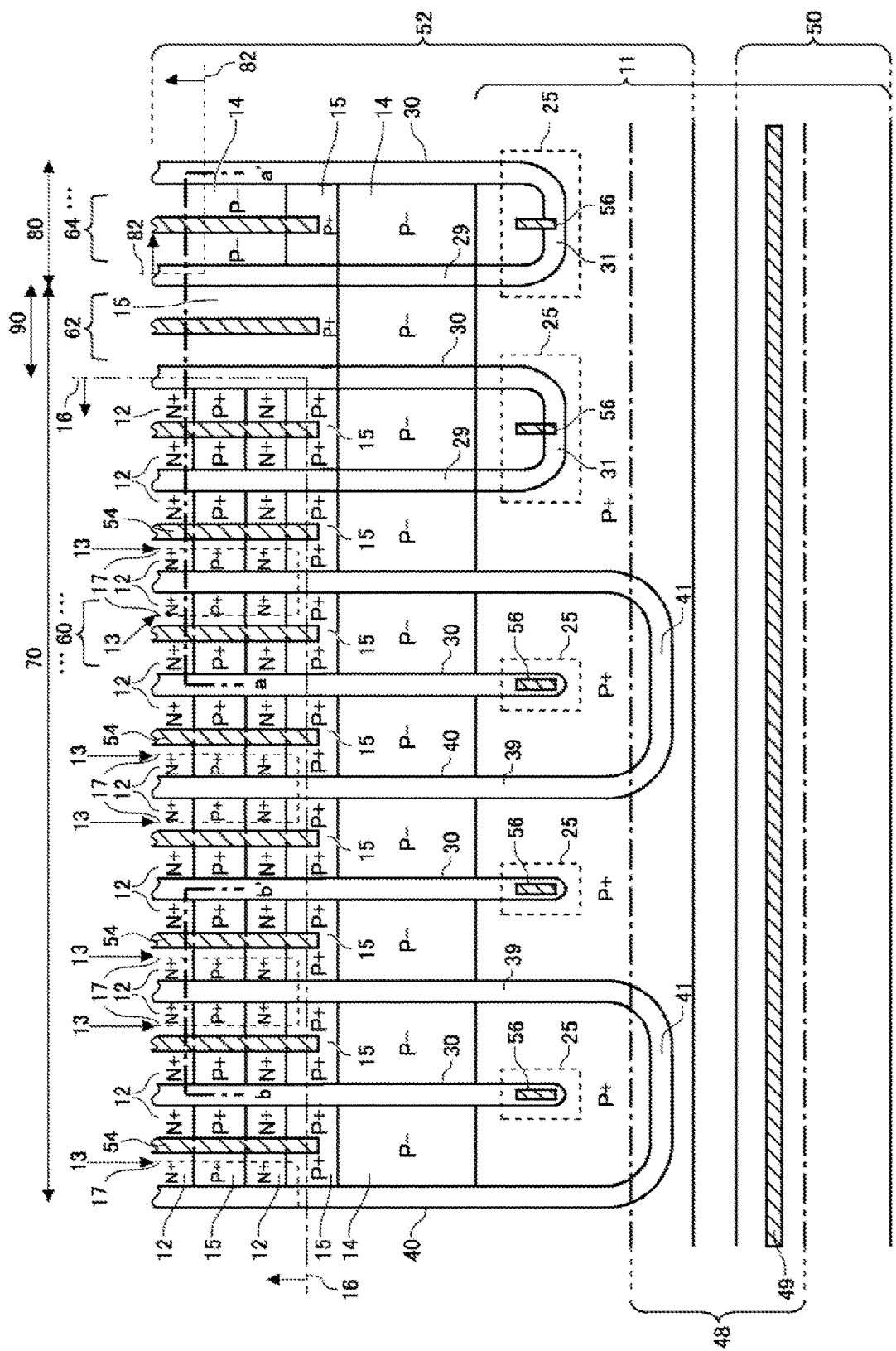
FIG. 1a shows a partial view of an example of the upper surface of a semiconductor device 100 according to the present embodiment.

FIG. 1a shows a partial view of an example of the upper surface of a semiconductor device 100 according to the present embodiment. The semiconductor device 100 of the present example is a semiconductor chip including a transistor section 70 and a diode section 80. The transistor section 70 includes transistors such as IGBTs. The diode section 80 includes diodes such as FWDs (Free Wheel Diodes). The transistor section 70 and the diode section 80 are arranged in an array along a predetermined array direction (Y-axis direction in the present example) on the upper surface of the semiconductor substrate. In the example of FIG. 1a, the transistor section 70 and the diode section 80 are alternately arranged along the array direction. The transistor section 70 and the diode section 80 may be in contact or spaced apart in the array direction. The transistor section 70 may include a boundary section 90. In the example of FIG. 1a, the boundary section 90 is a region of the transistor section 70 positioned at the boundary with the diode section 80. FIG. 1a shows the upper surface of the chip in the vicinity of an end of the chip, and does not show the other regions.

While FIG. 1a shows an active region of the semiconductor substrate in the semiconductor device 100, the semiconductor device 100 may include an edge termination structure surrounding the active region. The active region refers to a region in which currents flow when the semiconductor device 100 is controlled into ON state. The edge termination structure relaxes the concentration of electric fields near the upper surface the semiconductor substrate. The edge termination structure includes, for example, a guard ring, field plate or RESURF structure, or combinations thereof.

The semiconductor device 100 of the present example is provided inside the semiconductor substrate, and includes gate trench portions 40, dummy trench portions 30, well regions 11, emitter regions 12, base regions 14 and contact regions 15, exposed on the upper surface of the semiconductor substrate. The semiconductor device 100 of the present example also includes an emitter electrode 52 and a gate metal layer 50 provided above the upper surface of the semiconductor substrate. The emitter electrode 52 and the gate metal layer 50 are separated from each other.

Although not shown in FIG. 1a, an interlayer dielectric film is provided between the upper surface of the semiconductor substrate and each of the emitter electrode 52 and the gate metal layer 50. In the present example, the interlayer dielectric film is provided with contact holes 56, contact holes 49 and contact holes 54 penetrating the interlayer dielectric film.

The emitter electrode 52 is connected to dummy conductive portions inside the dummy trench portions 30 via the contact holes 56. Connecting portions 25, formed of a conductive material such as impurity-doped polysilicon, may be provided between the emitter electrode 52 and the dummy conductive portions. An insulating film such as an oxide film is provided between the connecting portions 25 and the upper surface of the semiconductor substrate.

The gate metal layer 50 contacts a gate runner 48 through a contact hole 49. The gate runner 48 is formed of impurity-doped poly silicon or the like. The gate runner 48 is connected to gate conductive portions inside the gate trench portions 40 at the upper surface of the semiconductor substrate. The gate runner 48 is not connected to the dummy conductive portions inside the dummy trench portions 30. In the present example, the gate runner 48 is provided from a position below the contact hole 49 to edge portions of the gate trench portions 40. An insulating film such as an oxide film is provided between the gate runner 48 and the upper surface of the semiconductor substrate. At the edge portions of the gate trench portions 40, the gate conductive portions are exposed on the upper surface of the semiconductor substrate and contact the gate runner 48.

The emitter electrode 52 and the gate metal layer 50 are formed of a metal-containing material. For example, at least a partial region of each electrode is formed of aluminum or an aluminum-silicon alloy. Each electrode may include a barrier metal formed of titanium, a titanium compound or the like in a layer below the region formed of aluminum or the like, and may include a plug formed of tungsten or the like in the contact hole.

One or more gate trench portions 40 and one or more dummy trench portions 30 are arrayed at predetermined intervals along a predetermined array direction (Y-axis direction in the present example). Each gate trench portion 40 may have two extending portions 39 extending along an extending direction (X-axis direction in the present example) parallel to the upper surface of the semiconductor substrate and orthogonal to the array direction, and a connecting portion 41 connecting the two extending portions 39. At least a part of the connecting portion 41 is preferably provided in a curved shape. Connecting the ends of the two extending portions 39 of the gate trench portion 40 can relax the concentration of electric fields at the ends of the extending portions 39. In this specification, each extending portion 39 of the gate trench portion 40 may be regarded as one gate trench portion 40. The gate runner 48 may be connected to the gate conductive portions at the connecting portions 41 of the gate trench portions 40.

At least one dummy trench portion 30 may be provided between the extending portions 39 of each gate trench portion 40. The dummy trench portion 30 may have a U-shape on the upper surface of the semiconductor substrate, in like manner with the gate trench portion 40. That is, in the present example, the dummy trench portion 30 may have two extending portions 29 extending along the extending direction and a connecting portion 31 connecting the two extending portions 29.

At least one dummy trench portion 30 may have the shape of a straight line whose longitudinal direction is the extending direction (the X-axis direction) on the upper surface of the semiconductor substrate. In the example of FIG. 1a, U-shaped dummy trench portions 30 are provided in the diode section 80 and the boundary section 90 and straight line-shaped dummy trench portions 30 are provided in at least a part of the transistor section 70.

The emitter electrode 52 is provided above the gate trench portions 40, the dummy trench portions 30, the well regions 11, the emitter regions 12, the base regions 14 and the contact regions 15. The well regions 11 are of the second conductivity type. In the present example, the well regions 11 are of (P+)-type, as an example. Each well region 11 is provided over a predetermined area from an end closer to the gate metal layer 50 in the active region. The diffusion depth of the well region 11 may be deeper than the lower ends of the gate trench portions 40 and the dummy trench portions 30. Partial regions of the gate trench portions 40 and the dummy trench portions 30 closer to the gate metal layer 50 are provided in the well region 11. The bottoms of the extending-direction ends of the gate trench portions 40 and the dummy trench portions 30 may be covered by the well region 11.

In the transistor section 70, the contact holes 54 are provided above the contact regions 15 and the emitter regions 12. In the diode section 80, the contact hole 54 is provided above the base region 14. No contact hole 54 is arranged above the base regions 14 and well regions 11 arranged on both X-axis-direction ends.

In a direction parallel to the upper surface of the semiconductor substrate, mesa portions are provided in direct contact with the trench portions in the Y-axis direction. A mesa portion may be the portion of the semiconductor substrate that is sandwiched between two adjacent trench portions and extends from the upper surface of the semiconductor substrate to the greatest depth of the bottom portion of each trench portion. Each extending portion of the trench portions may be regarded as one trench portion. That is, the region sandwiched between two extending portions may be regarded as a mesa portion.

In the transistor section 70, except in the boundary section 90, first mesa portions 60 are provided in contact with trench portions. In the boundary section 90, a second mesa portion 62 is provided in contact with trench portions. In the diode section 80, third mesa portions 64 are provided in the regions sandwiched between adjacent dummy trench portions 30 and in contact with the dummy trench portions 30. Base regions 14, as an example, are provided at both X-axis-direction ends of the first mesa portions 60, the second mesa portion 62 and the third mesa portions 64. Note that FIG. 1a only shows one of the X-axis-direction ends.

On the upper surface of the first mesa portions 60, first-conductivity-type emitter regions 12 are provided in contact with gate trench portions 40. In the present example, the emitter regions 12 are of (N+)-type, as an example. On the upper surface the first mesa portions 60, second-conductivity-type contact regions 15 having a higher doping concentration than the base regions 14 are also provided. In the present example, the contact regions 15 are of (P+)-type, as an example. In the first mesa portions 60, the emitter regions 12 and the contact regions 15 may be alternately provided along the extending direction of the gate trench portions 40. The emitter regions 12 and the contact regions 15 may be provided in contact with each other.

On the upper surface of the first mesa portions 60, the emitter regions 12 may be provided in contact with or spaced apart from dummy trench portions 30. In the example of FIG. 1a, the emitter regions 12 are provided in contact with dummy trench portions 30.

On the upper surface of the first mesa portions 60, the emitter regions 12 and the contact regions 15 are provided also below the contact hole 54. On the upper surface of the first mesa portions 60, the emitter regions 12 and the contact regions 15 are provided continuously in the Y-axis direction from one of the trench portions sandwiching each first mesa portion 60 to the other trench portion. The emitter regions 12 and the contact regions 15 may be in contact with both of the two trench portions sandwiching each first mesa portion 60. In the example of FIG. 1a, two trench portions sandwiching each first mesa portion 60 are a gate trench portion 40 and a dummy trench portion 30.

A second-conductivity-type contact region 15 having a higher doping concentration than the base regions 14 is provided on the upper surface of the second mesa portion 62. The contact region 15 may be provided between the base regions 14 at both X-axis-direction ends of the second mesa portion 62. The contact region 15 may be provided in the entire region sandwiched between the base regions 14 at both ends.

On the upper surface of the second mesa portion 62, the contact region 15 is provided also below the contact hole 54. On the upper surface of the second mesa portion 62, the contact region 15 is provided continuously in the Y-axis direction from one of the dummy trench portions 30 sandwiching the second mesa portion 62 to the other dummy trench portion 30. The contact region 15 may be in contact with both of the two dummy trench portions 30 sandwiching the second mesa portion 62.

In the present example, two contact regions 15 are provided in the region of the upper surface of each third mesa portion 64 that is sandwiched between the base regions 14 at both X-axis-direction ends. The respective contact regions 15 may be arranged in contact with the base regions 14 at both ends. On the upper surface of the third mesa portion 64, a base region 14 is provided in the region sandwiched between the contact regions 15. The base region 14 may be provided in the entire region sandwiched between the contact regions 15.

On the upper surface of the third mesa portion 64, the base region 14 is provided also below the contact hole 54. On the upper surface of the third mesa portion 64, the base region 14 is provided continuously in the Y-axis direction from one of the dummy trench portions 30 sandwiching the third mesa portion 64 to the other dummy trench portion 30. The base region 14 may be in contact with both of the two dummy trench portions 30.

In the semiconductor device 100 of the present example, dummy trench portions 30 are provided in the diode section 80. In the present example, each dummy trench portion 30 arranged in the diode section 80 has straight line-shaped extending portions 29 connected at a connecting portion 31. The third mesa portions 64 are provided in the regions sandwiched between the extending portions 29.

Emitter regions 12 may or may not be provided in the third mesa portions 64. In the present example, no emitter region 12 is provided in the third mesa portions 64. In each third mesa portion 64, the contact regions 15 and the base regions 14 are provided from one of the dummy trench portions 30 sandwiching the third mesa portion 64 to the other dummy trench portion 30. That is, on the upper surface of the semiconductor substrate, the Y-axis direction width of each third mesa portion 64 is equal to the Y-axis direction width of each contact region 15 or base region 14 provided in the third mesa portion 64.

The diode section 80 includes a first-conductivity-type cathode region 82 on the lower surface side of the semiconductor substrate. In FIG. 1a, the region in which the cathode region 82 is provided is indicated by dashed lines. The diode section 80 may be the region in which the cathode region 82 is projected onto the upper surface of the semiconductor substrate. The region in which the cathode region 82 is projected onto the upper surface of the semiconductor substrate may be spaced apart, toward the inner side of the third mesa portion 64, from the contact region 15 of the third mesa portion 64. The inner side of the third mesa portions 64 refers to the side closer to the center of the third mesa portion 64 in the X-axis direction. A second-conductivity-type collector region may be provided in the region in direct contact with the lower surface of the semiconductor substrate and in which the cathode region 82 is not provided. The transistor section 70 may be the region in which trench portions or mesa portions provided in the region in which the collector region is projected onto the upper surface of the semiconductor substrate.

The semiconductor device 100 includes, inside the semiconductor substrate, first-conductivity-type accumulation regions 16 having a higher doping concentration than the drift region. The dopant of the accumulation regions 16 is of the same conductivity type as the dopant of the drift region. The dopant of the accumulation regions 16 is accumulated at a higher concentration than the dopant for the drift region. The accumulation regions 16 are arranged below base regions 14. The accumulation regions 16 may be arranged above the lower end of each trench portion. The accumulation regions 16 may be in contact with gate trench portions 40. Providing the accumulation regions 16 can enhance the carrier injection-enhancement effect (IE effect) to reduce the ON voltage. In FIG. 1a, the region in which the accumulation regions 16 are provided is indicated by long dashed short dashed lines. Note that, while in the dashed lines traverse regions of trench portions in FIG. 1a, the accumulation regions 16 may not be formed in the regions overlapping with the trench portions.

In first mesa portions 60, second-conductivity-type floating regions 17 are provided below the accumulation regions 16. The floating regions 17 are in contact with gate trench portions 40. In the present example, the floating regions 17 are of (P+)-type, as an example. The doping concentration of the floating regions 17 is higher than the doping concentration of the base regions 14. In FIG. 1a, the region in which the floating regions 17 are provided in top view of the semiconductor substrate is indicated by dashed lines. Note that, while the dashed lines traverse regions of trench portions in FIG. 1a, the floating regions 17 may not be formed in the regions overlapping with the trench portions.

As shown in FIG. 1a, in top view of the semiconductor substrate, each floating region 17 is provided in a part of the first mesa portion 60 in the array direction (Y-axis direction) orthogonal to the extending direction of the gate trench portions 40. That is, each floating region 17 is not provided over the entire width of the first mesa portion 60 in the Y-axis direction, but is provided over a partial region thereof in the Y-axis direction. In the example of FIG. 1a, each floating region 17 is provided continuously from the position contacting a gate trench portion 40 to a predetermined Y-axis direction position within the first mesa portion 60. The floating region 17 is not provided at a position farther from the gate trench portion 40 than the predetermined position.

The predetermined position may be between two trench portions sandwiching the first mesa portion 60. The two trench portions sandwiching the first mesa portion 60 are respectively referred to as a first trench portion and a second trench portion. The first trench portion is a gate trench portion 40 contacting the floating region 17. The second trench portion may be a dummy trench portion 30 or may be a gate trench portion 40. In the present example, the second trench portion is a dummy trench portion 30. The predetermined position is a position spaced apart, in the array direction, from the second trench portion. In top view of the semiconductor substrate, the array-direction end of each floating region 17 is referred to as a floating region end 13. The floating region end 13 may be positioned at the predetermined position. That is, the floating region 17 may be spaced apart from the second trench portion.

The predetermined Y-axis direction position in each first mesa portion 60 may or may not overlap with the contact hole 54 in top view of the semiconductor substrate. FIG. 1a shows an example where the predetermined position does not overlap with the contact hole 54. Each floating region 17 may be provided closer to the gate trench portion 40 than the contact hole 54 in the Y-axis direction.

Each floating region 17 may be provided continuously from one of the contact regions 15 provided at both X-axis-direction ends of the first mesa portion 60 to the other. As described above, the floating regions 17 may be provided in contact with gate trench portions 40.

The positions of both X-axis-direction ends of the floating regions 17 may coincide with or different from the positions of both X-axis-direction ends of the accumulation regions 16. FIG. 1a shows a case where the X-axis-direction end of the floating regions 17 and the X-axis-direction end of the accumulation regions 16 are at different positions.

In the first mesa portions 60, the floating regions 17 may not be in contact with dummy trench portions 30. Floating regions 17 may not be provided in the second mesa portion 62 and the third mesa portions 64.

Figure 1B:
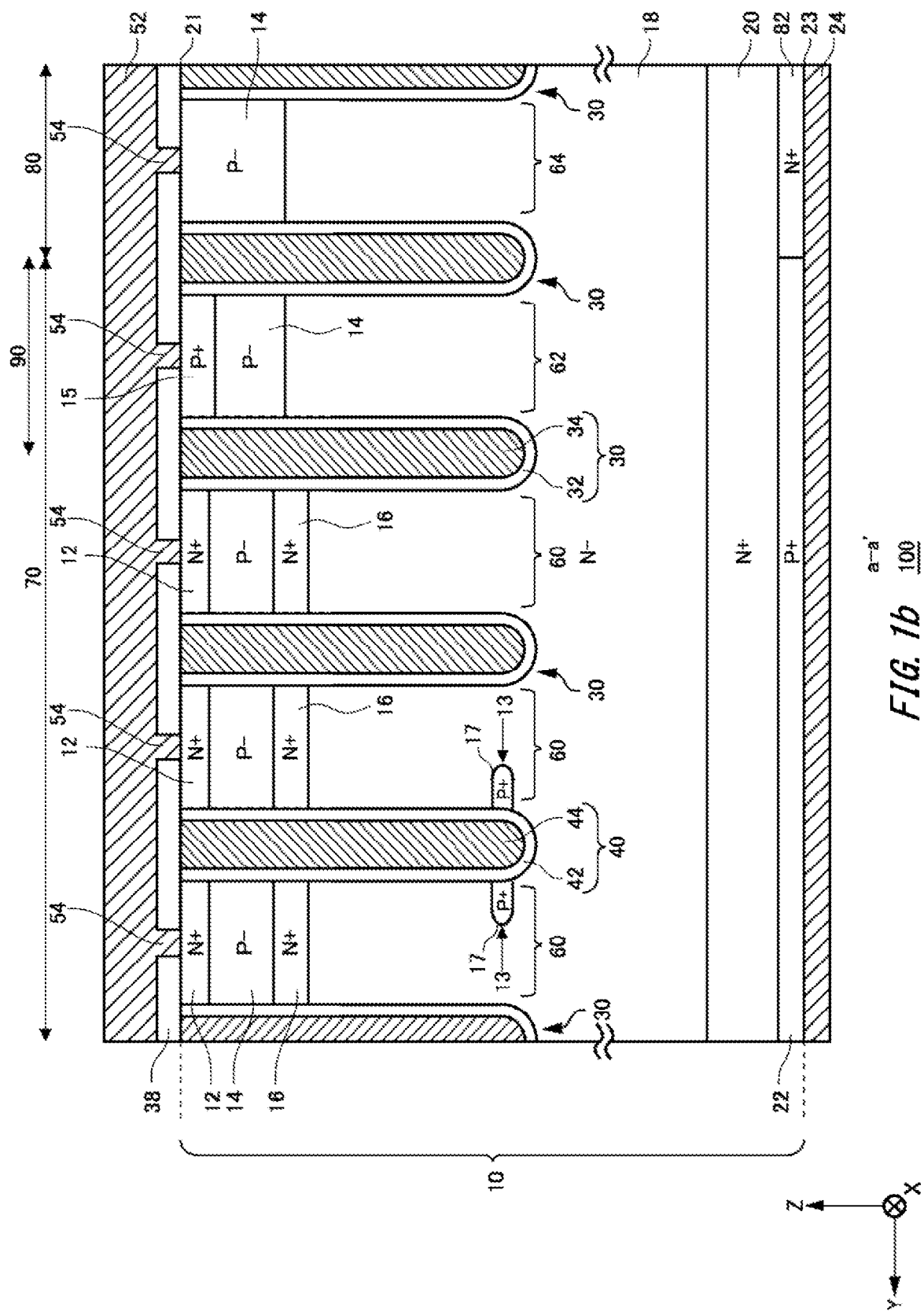

FIG. 1b shows an example of the cross section along a-a' in FIG. 1a. The cross section along a-a' is a Y-Z plane passing through emitter regions 12 of first mesa portions 60 and the contact region 15 of the second mesa portion 62. The semiconductor device 100 of the present example includes, in the cross section along a-a', the semiconductor substrate 10, an interlayer dielectric film 38, the emitter electrode 52 and a collector electrode 24. The emitter electrode 52 is provided on the upper surfaces of the interlayer dielectric film 38 and the semiconductor substrate 10.

The collector electrode 24 is provided on a lower surface 23 of the semiconductor substrate 10. The emitter electrode 52 and the collector electrode 24 are formed of a conductive material such as a metal. In this specification, the direction connecting the emitter electrode 52 and the collector electrode 24 is referred to as the depth direction (Z-axis direction).

The semiconductor substrate 10 may be a silicon substrate, a silicon carbide substrate, a nitride semiconductor substrate such as gallium nitride, a gallium oxide substrate, or the like. In the present example, the semiconductor substrate 10 is a silicon substrate.

The semiconductor substrate 10 includes a first-conductivity-type drift region 18. In the present example, the drift region 18 is of (N-)-type. The drift region 18 may be the remaining region of the semiconductor substrate 10 in which the other doped regions are not provided.

One or more gate trench portions 40 and one or more dummy trench portions 30 are provided in the upper surface 21 of the semiconductor substrate 10. Each trench portion is provided from the upper surface 21 to penetrate the base region 14 and reach the drift region 18.

Each gate trench portion 40 includes a gate trench provided in the upper surface 21, a gate insulating film 42 and a gate conductive portion 44. The gate insulating film 42 is provided to cover the inner wall of the gate trench. The gate insulating film 42 may be formed by oxidizing or nitriding the semiconductor material of the inner wall of the gate trench. The gate conductive portion 44 is provided inside the gate trench and at an inner side relative to the gate insulating film 42. That is, the gate insulating film 42 insulates the gate conductive portion 44 and the semiconductor substrate 10 from each other. The gate conductive portion 44 is formed of a conductive material such as poly silicon.

The gate conductive portion 44 includes, in the depth direction, a region facing at least adjacent base regions 14 with intervention of the gate insulating film 42. In this cross section, the gate trench portion 40 is covered by the interlayer dielectric film 38 on the upper surface 21. When a predetermined voltage is applied to the gate conductive portion 44, a channel is formed as an inversion layer of electrons in the interfacial surface layer of the base region 14 contacting the gate trench.

In this cross section, the dummy trench portions 30 may have the same structure as the gate trench portions 40. Each dummy trench portion 30 includes a dummy trench provided in the upper surface 21, a dummy insulating film 32 and a dummy conductive portion 34. The dummy insulating film 32 is provided to cover the inner wall of the dummy trench. The dummy conductive portion 34 is provided inside the dummy trench and provided at an inner side relative to the dummy insulating film 32. The dummy insulating film 32 insulates the dummy conductive portion 34 and the semiconductor substrate 10 from each other.

The dummy conductive portion 34 may be formed of the same material as that of the gate conductive portion 44. For example, the dummy conductive portion 34 is formed of a conductive material such as polysilicon. The dummy conductive portion 34 may have the same length in the depth direction as the gate conductive portion 44. In this cross section, the dummy trench portions 30 are covered by the interlayer dielectric film 38 on the upper surface 21. Note that, the bottom portions of the dummy trench portions 30 and gate trench portions 40 may have a shape of a downwardly-convex curved surface (curved line in the cross section).

In each first mesa portion 60, one or more first-conductivity-type accumulation regions 16 are provided above the drift region 18. The accumulation regions 16 may be in contact with gate trench portions 40. If a plurality of accumulation regions 16 are provided, the accumulation regions 16 are arranged in an array along the Z-axis direction. The drift region 18 may be provided between the accumulation regions 16. The accumulation regions 16 are of (N+)-type, as an example. The doping concentration of the accumulation regions 16 is higher than the doping concentration of the drift region 18. Providing the accumulation regions 16 can enhance the carrier injection-enhancement effect (IE effect) to reduce the ON voltage.

In the first mesa portion 60, one or more accumulation regions 16 may be in contact with or spaced apart from dummy trench portions 30. FIG. 1b shows an example where accumulation regions 16 are provided in contact with dummy trench portions 30. Note that accumulation regions 16 may not be provided in the second mesa portion 62 and the third mesa portions 64.

In each first mesa portion 60, a second-conductivity-type base region 14 is provided above the accumulation regions 16. The base region 14 may be in contact with a gate trench portion 40. The base region 14 is of (N−)-type, as an example. In each first mesa portion 60, the base region 14 may be provided in contact with a dummy trench portion 30.

In the cross section along a-a', in first mesa portions 60, emitter regions 12 are provided in contact with the upper surface 21 of the semiconductor substrate 10. The emitter regions 12 are in contact with a gate trench portion 40. The doping concentration of the emitter regions 12 is higher than the doping concentration of the drift region 18. In a Y-Z cross section passing through contact regions 15 in first mesa portions 60, contact regions 15 are provided instead of the emitter regions 12 shown in FIG. 1b. The contact regions 15 are exposed on the upper surface 21 of the semiconductor substrate 10. The contact regions 15 may be in contact with a gate trench portion 40 and a dummy trench portion 30.

In the second mesa portion 62 of the boundary section 90, a second-conductivity-type base region 14 is provided above the drift region 18. The base region 14 may be in contact with dummy trench portions 30.

In the second mesa portion 62, a contact region 15 is provided in contact with the upper surface 21 of the semiconductor substrate 10. The contact region 15 may be in contact with or spaced apart from dummy trench portions 30. FIG. 1b shows an example where the contact region 15 is provided in contact with dummy trench portions 30.

In each third mesa portion 64 of the diode section 80, a second-conductivity-type base region 14 is provided above the drift region 18. In each third mesa portion 64, the base region 14 is provided in contact with the upper surface 21. The base region 14 may be in contact with dummy trench portions 30.

A first-conductivity-type buffer region 20 may be provided below the drift region 18. The buffer region 20 is of (N+)-type, as an example. The doping concentration of the buffer region 20 is higher than the doping concentration of the drift region 18. The buffer region 20 may serve as a field stop layer to prevent a depletion layer expanding from the lower surface side of the base region 14 from reaching the (P+)-type collector region 22 and the (N+)-type cathode region 82.

In the transistor section 70, a collector region 22 of (P+)-type is provided below the buffer region 20 and exposed on the lower surface 23. In the diode section 80, a cathode region 82 of (N+)-type is provided below the buffer region 20 and exposed on the lower surface 23. In the boundary section 90, either the collector region 22 or the cathode region 82 is provided below the buffer region 20. In the present example, in the boundary section 90, the collector region 22 is provided below the buffer region 20.

Note that the diode section 80 is the region overlapping with the cathode region 82 in the direction perpendicular to the lower surface 23. The transistor section 70 is the region overlapping with the collector region 22 in the direction perpendicular to the lower surface 23 and in which predetermined unit structures including emitter regions 12 and contact regions 15 are regularly arranged.

In a first mesa portion 60 of the transistor section 70, a floating region 17 is provided below the accumulation region 16. The floating region 17 is provided in contact with a gate trench portion 40. The floating region 17 is provided in a part of the first mesa portion 60 in the array direction (Y-axis direction). The floating region 17 may be spaced apart from a dummy trench portion 30, rather than contacting it.

The region between the floating region 17 and the dummy trench portion 30 may be the drift region 18. The region between the floating region 17 and the accumulation region 16 may also be the drift region 18. In this cross section, the floating region 17 may be surrounded by the gate trench portion 40 and the drift region 18.

No floating region 17 may be provided for the dummy trench portions 30 of the second mesa portion 62 in the boundary section 90. No floating region 17 may be provided for the dummy trench portions 30 of the third mesa portions 64 in the diode section 80.

The doping concentration of the floating region 17 may be substantially equal to the doping concentration of the contact region 15, or may be lower than or higher than the doping concentration of the contact region 15. Note that the doping concentration of the floating region 17 is high to an extent that an inversion layer of electrons (channel) is not formed in the interface with the gate trench portion 40 when a gate voltage is applied to the gate conductive portion 44. As an example, the doping concentration of the floating region 17 may be between $1\times10^{17}/cm^3$ and $5\times10^{20}/cm^3$, inclusive.

The floating region 17 is not in contact with either the collector electrode 24 or the emitter electrode 52. The floating region 17 may or may not be continuous with the base region 14 as a P-type region.

Figure 2A:
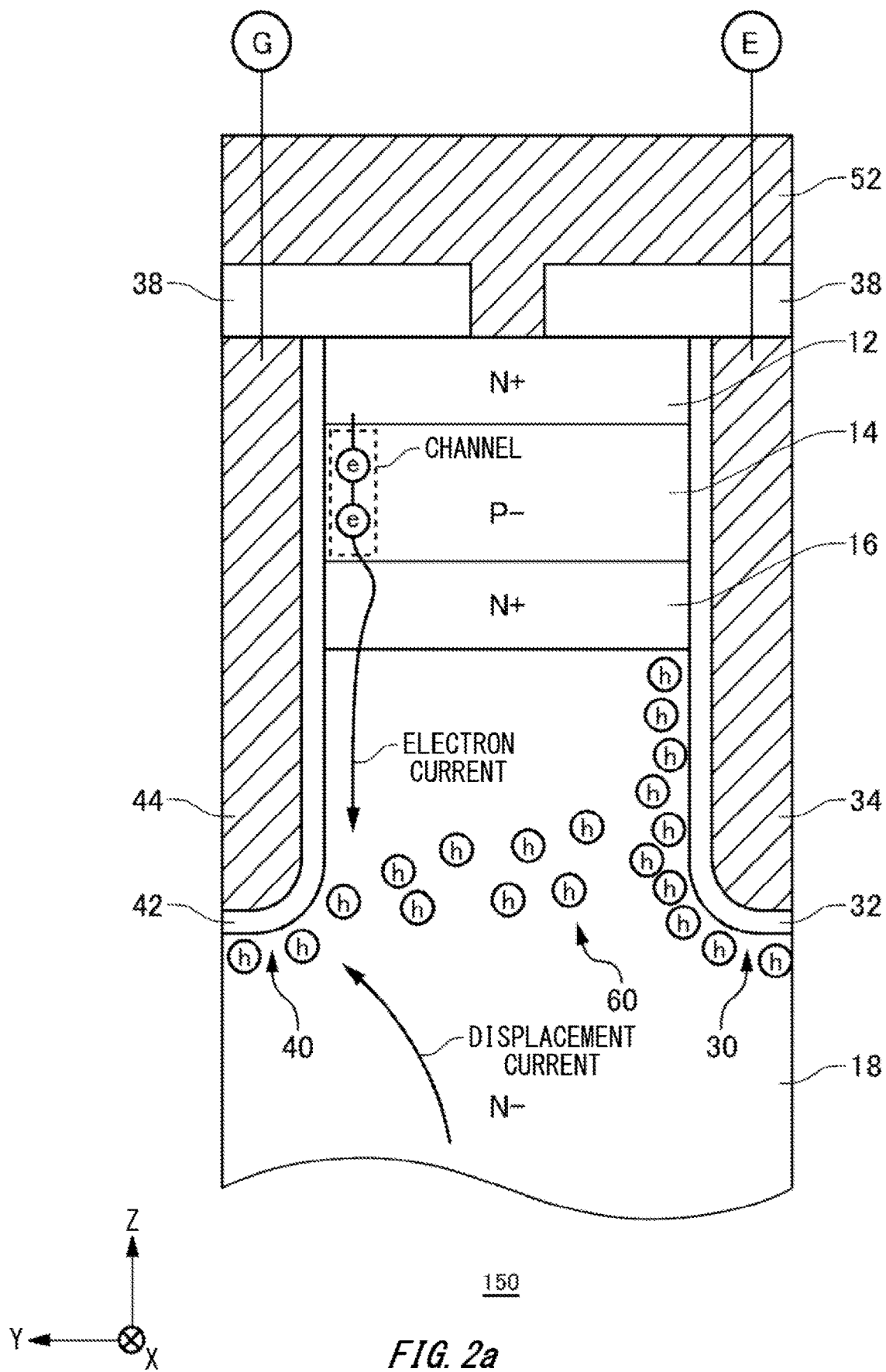
FIG. 2a shows the paths of electron current and displacement current in a semiconductor device 150 according to a first comparative example.

FIG. 2a shows the paths of electron current and displacement current in a semiconductor device 150 according to a first comparative example. The semiconductor device 150 of the first comparative example includes one accumulation region 16 in a first mesa portion 60 of the transistor section 70. In the first comparative example, no floating region 17 is provided. FIG. 2a shows current paths during turn-on. During turn-on, the voltage of the gate conductive portion 44 gradually rises from 0 [V]. Then, in the base region 14 in the vicinity of the gate trench portion 40, negative charge is induced to form a channel.

Electron current, rather than hole current, mainly flows during an early period of turn-on. The early period refers to the period that begins immediately before gate voltage Vg reaches a threshold voltage and ends before entering a Miller period, in which Vg is constant at approximately the value of the threshold voltage. When Vg becomes near the threshold voltage, a channel begins to open and the injection of electrons into the drift region 18 begins.

In the first comparative example of FIG. 2a, electrons moving downward from the channel first begin to flow in the negative Y-axis direction (the direction from the vicinity of the gate trench portion 40 toward the center of the first mesa portion 60) in the first accumulation region 16. However, in the drift region 18 below the first accumulation region 16, an accumulation layer of electrons is already formed in the vicinity of the gate trench portion 40 (the threshold voltage for an accumulation layer of electrons to be formed in an N-type region is much smaller than the threshold voltage for an inversion layer in a P-type region), and therefore impedance is lower in the vicinity of the gate trench portion 40 than in the drift region 18. Thus, electron current mainly flows in the vicinity of the gate trench portion 40.

When electrons reach the collector region 22 on the back side, the injection of holes from the collector region 22 to the buffer region 20 and the drift region 18 begins. In this manner, holes are accumulated in the vicinity of the lower ends of trench portions. As an example, holes have a concentration between $1 \times 10^{16}/cm^3$ and $5 \times 10^{18}/cm^3$, inclusive, in the region from the vicinity of the lower end of the gate trench portion 40 to the side portion of the dummy trench portion 30 below the first accumulation region 16.

Holes are accumulated at the lower end of the gate trench portion 40 and the lower end of the dummy trench portion 30. In particular, since the dummy conductive portion 34 has the same potential as the emitter electrode 52, an inversion layer of holes is easily formed at the side wall of the dummy trench portion 30. Holes injected from the collector region 22 concentrate in the vicinity of this inversion layer of holes. Holes are distributed continuously from the dummy trench portion 30 to the lower end of the gate trench portion 40. Due to such distribution of holes, a large displacement current flows into the vicinity of the lower end of the gate trench portion 40 during turn-on.

The displacement current generated due to the accumulation of holes causes charging of the gate conductive portion 44 opposing across the gate insulating film 42. The charging of the gate conductive portion 44 causes a momentary increase in Vg of the gate metal layer. The larger the displacement current is, the more the gate conductive portion 44 is charged, and the more quickly the potential of the gate conductive portion 44 increases. As a result, the potential of the gate conductive portion 44 momentarily exceeds the gate threshold.

When the potential of the gate conductive portion 44 momentarily exceeds the gate threshold, the injection of large amounts of electrons and holes begins, and the current flowing between the collector electrode 24 and the emitter electrode 52 (CE current) increases. The rate of decrease in the voltage between the collector electrode 24 and the emitter electrode 52 (CE voltage), (dVce/dt), increases as a function of the change rate of the increasing CE current. The larger the displacement current is, the larger (dVce/dt) is. In particular, the smaller the amount of accumulated holes that flow toward the emitter electrode 52 is, the larger the displacement current is, and the larger the momentary increase in the potential of the gate conductive portion 44 is. Thus, in the first comparative example of FIG. 2a, (dVce/dt) is large, and also electromagnetic noise is significant.

Figure 2B:
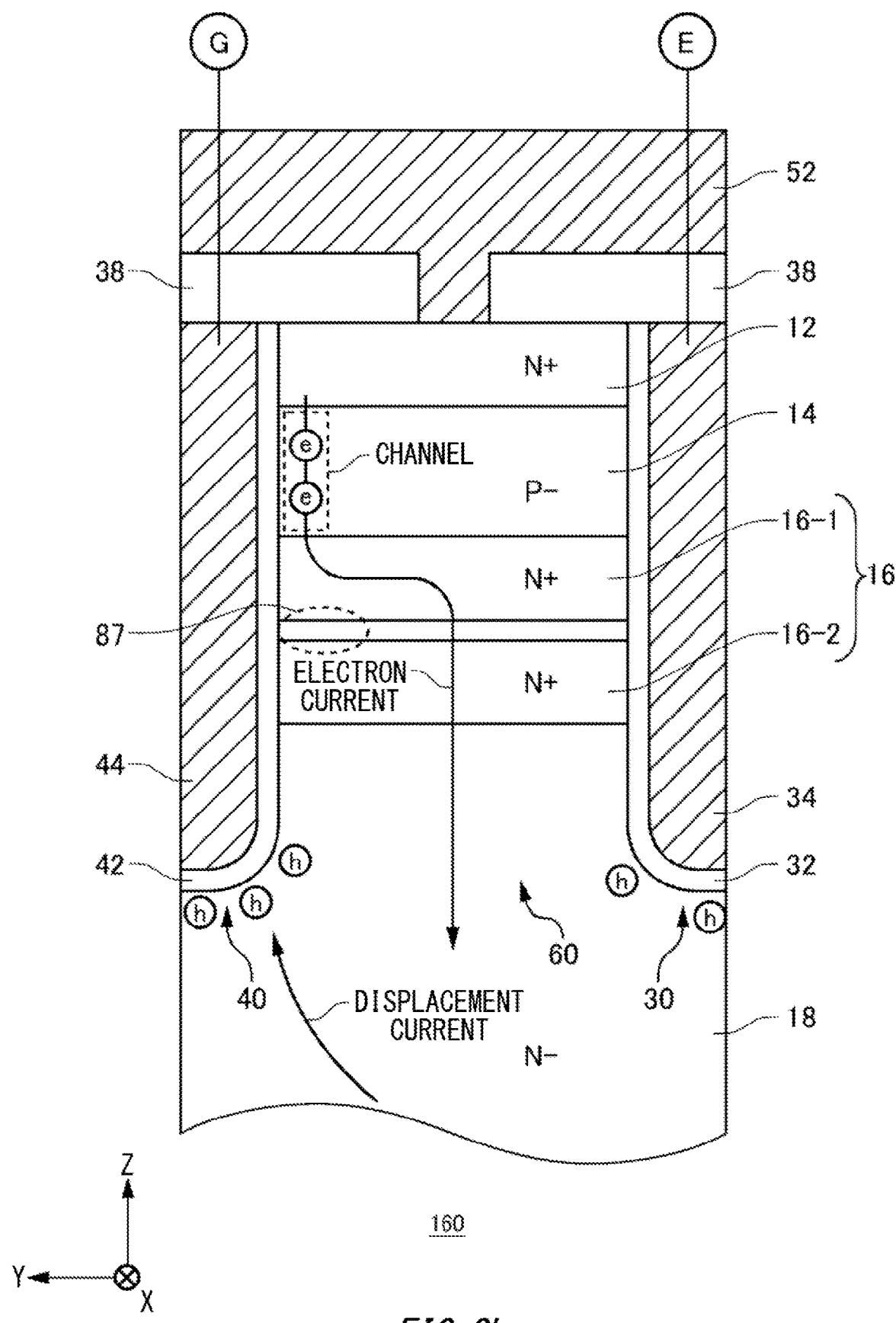
FIG. 2b shows the paths of electron current and displacement current in a semiconductor device 160 according to a second comparative example.

FIG. 2b shows the paths of electron current and displacement current in a semiconductor device 160 according to a second comparative example. The semiconductor device 160 of the second comparative example includes a first accumulation region 16-1 and a second accumulation region 16-2 in a first mesa portion 60 of the transistor section 70. The second accumulation region 16-2 is provided below the first accumulation region 16-1. In the semiconductor device 160 of the second comparative example, the doping concentration of the second accumulation region 16-2 is higher than the doping concentration of the first accumulation region 16-1. In the second comparative example, no floating region 17 is provided.

Electrons, after passing through the channel, first begin to flow in the negative Y-axis direction (the direction from the vicinity of the gate trench portion 40 toward the center of the first mesa portion 60) in the first accumulation region 16-1. In the present example, since the second accumulation region 16-2 has a higher doping concentration than the first accumulation region 16-1, impedance for electron current is lower along the path of directly flowing from the first accumulation region 16-1 to the second accumulation region 16-2 than along the path of flowing from the vicinity of the center of the first accumulation region 16-1, returning to the vicinity of the gate trench portion 40, and reaching the second accumulation region 16-2. Thus, the electron current easily flows from the vicinity of the center of the first accumulation region 16-1 to the second accumulation region 16-2 without returning to the vicinity of the gate trench portion 40.

Holes are easily accumulated in a high hole concentration region 87, a region below the first accumulation region 16 and in direct contact with the gate trench portion 40. Also, electron current flows in the vicinity of the center of the first mesa portion 60 rather than the vicinity of the gate trench portion 40, so that the accumulation of holes in the high hole concentration region 87 is facilitated. This facilitates the flowing of electron current in the vicinity of the center of the first mesa portion 60.

As the electron current flows in the vicinity of the center of the first mesa portion 60, the hole distribution in the vicinity of the bottom portion of the first mesa portion 60 is divided at the vicinity of the center of the first mesa portion 60. Thus, holes closer to the dummy trench portion 30 than the path of electron current do not flow in the vicinity of the gate trench portion 40. The division of the hole distribution at the central portion of the first mesa portion 60 reduces the accumulation of holes at the lower end of the gate trench portion 40. As a result, the displacement current can be reduced. Due to the reduced displacement current, the charging of the gate conductive portion 44 is also reduced, and the momentary increase in Vg of the gate metal layer is also reduced. This reduces the rate of decrease in CE voltage (dVce/dt).

The accumulation region 16, provided in the vicinity of the base region 14, generates a negative capacitance between the gate and the collector (CG capacitance). In the semiconductor device 160 of the second comparative example, while the rate of decrease in CE voltage (dVce/dt) can be reduced as described above, providing two accumulation regions 16 may increase the CG capacitance. The increased CG capacitance worsens the trade-off between the ON voltage and turn-off loss of the transistor section 70.

Figure 3:
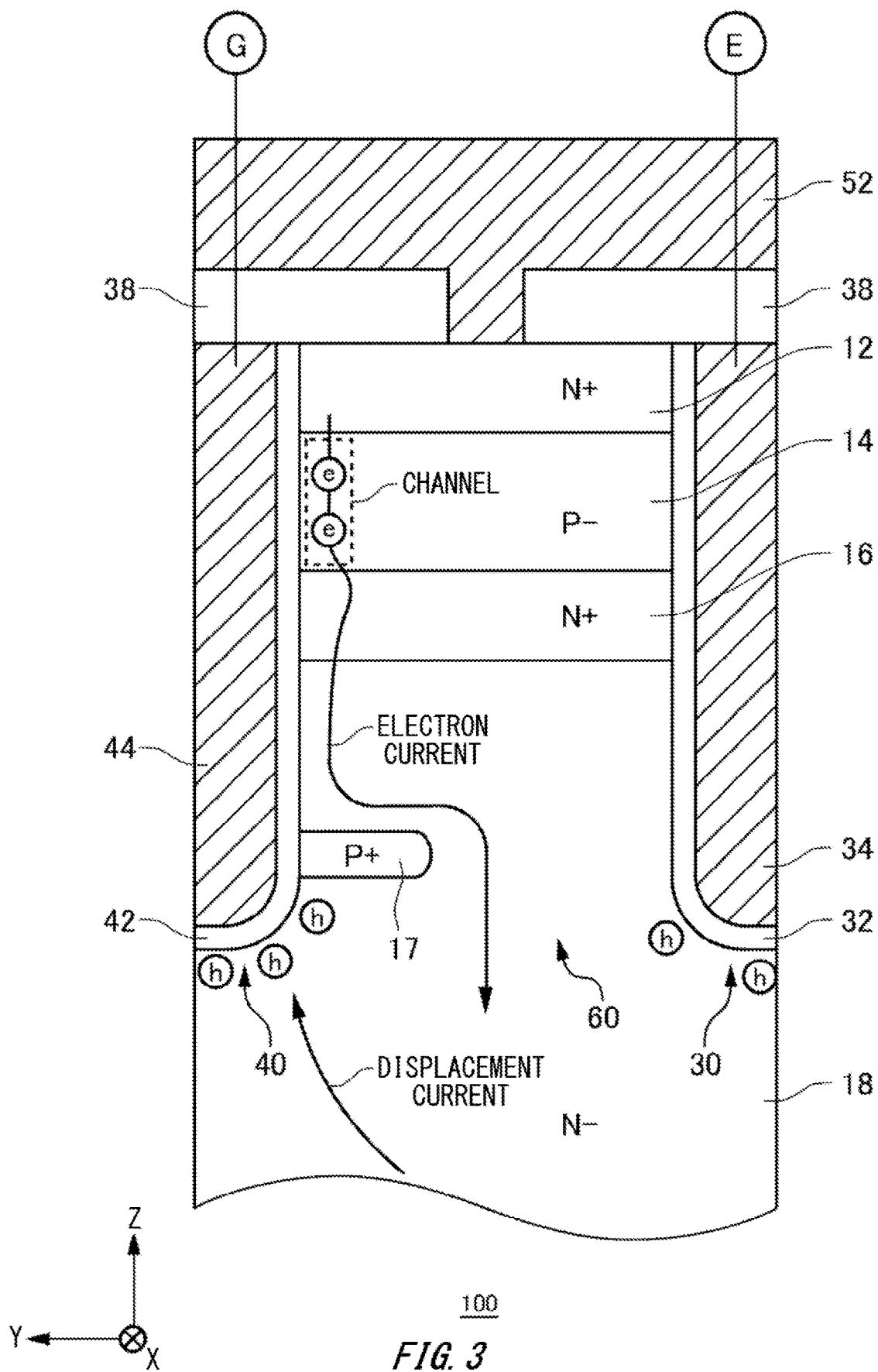
FIG. 3 shows an example of the paths of electron current and displacement current in the semiconductor device 100 according to the present embodiment.

FIG. 3 shows an example of the paths of electron current and displacement current in the semiconductor device 100 according to the present embodiment. FIG. 3 shows an example of the paths of electron current and displacement current when a floating region 17 is provided in contact with a gate trench portion 40.

In the semiconductor device 100 of the present example, electrons moving downward from the channel first begin to flow in the negative Y-axis direction (the direction from the vicinity of the gate trench portion 40 toward the center of the first mesa portion 60) in the first accumulation region 16. However, in the drift region 18 below the first accumulation region 16, an accumulation layer of electrons is already formed in the vicinity of the gate trench portion 40, and thus impedance is lower in the vicinity of the gate trench portion 40 than in the drift region 18. Thus, the electron current mainly flows in the vicinity of the gate trench portion 40 toward a lower portion of the semiconductor substrate 10.

The floating region 17 has a larger resistance against electron current than the drift region 18. As the semiconductor device 100 of the present example includes the floating region 17 below the accumulation region 16, the electron current flowing in the vicinity of the gate trench portion 40 toward a lower portion of the semiconductor substrate 10 is bent in its path by the floating region 17, and follows a path of flowing from the vicinity of the gate trench portion 40 into the vicinity of the center of the first mesa portion 60.

As the electron current flows in the vicinity of the center of the first mesa portion 60, the hole distribution in the vicinity of the bottom portion of the first mesa portion 60 is divided at the vicinity of the center of the first mesa portion 60. Thus, holes closer to the dummy trench portion 30 than the path of electron current do not flow in the vicinity of the gate trench portion 40. The division of the hole distribution at the vicinity of the center of the first mesa portion 60 reduces the accumulation of holes at the lower end of the gate trench portion 40. As a result, the displacement current can be reduced. Due to the reduced displacement current, the charging of the gate conductive portion 44 is also reduced, and the momentary increase in Vg of the gate metal layer is also reduced. This reduces the rate of decrease in CE voltage (dVce/dt).

Further, in the semiconductor device 100 of the present example, providing the floating region 17 allows electron current to flow in the vicinity of the center of the first mesa portion 60 even with only one accumulation region 16. Thus, the increase in the CG capacitance can be better prevented than in the case where a plurality of accumulation regions 16 are provided along the Z-axis direction as in the semiconductor device 160 of the second comparative example. That is, in the semiconductor device 100 of the present example, the increase in CG capacitance can be reduced while reducing the rate of decrease in CE voltage (dVce/dt). Thus, in the semiconductor device 100 of the present example, the turn-on loss can be reduced while reducing the rate of decrease in CE voltage (dVce/dt). Also, the trade-off between the ON voltage and the turn-off loss can be maintained.

Note that the operations of the semiconductor devices described with reference to FIG. 2a to FIG. 3 are operations in the transistor section 70, and it is apparent that a semiconductor device including no diode section 80 operates similarly. That is, even if the semiconductor device 100 includes no diode section 80, the effect of providing the floating region 17 occurs. The semiconductor device 100 may not include the diode section.

Figure 4A:
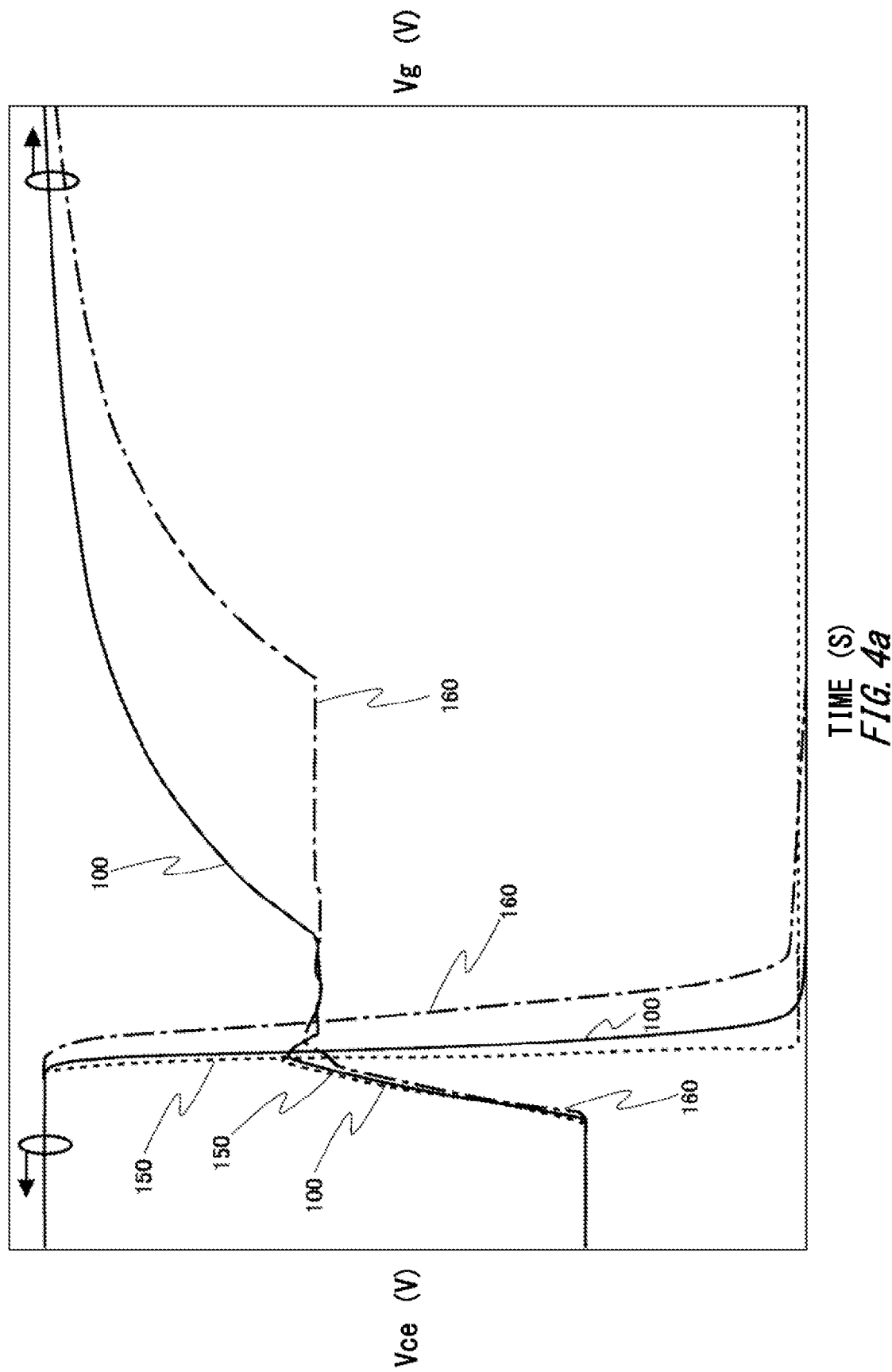

FIG. 4a shows an example of the time waveforms of gate voltage Vg and CE voltage Vce during turn-on. In FIG. 4a, the respective characteristics of the semiconductor device 100 of the present example, the semiconductor device 150 of the first comparative example and the semiconductor device 160 of the second comparative example are indicated by solid lines, dashed lines and long dashed short dashed lines. Note that the waveforms for the first comparative example 150 overlap with the waveforms for the semiconductor device 100 except in the portions where Vg and Vce transition over time.

FIG. 4b is an enlarged view of transitioning waveforms of gate voltage Vg and CE voltage Vce in the time waveforms of FIG. 4a. However, in FIG. 4b, the scale and position of the axis of CE voltage Vce are changed. As shown in FIG. 4a and FIG. 4b, in the semiconductor device 100, the changes in gate voltage Vg and CE voltage Vce during turn-on are gentler than in the semiconductor device 150 of the first comparative example. Thus, in the semiconductor device 100 of the present example, the turn-on loss can be reduced more than in the semiconductor device 150 of the first comparative example. Also, the trade-off between the ON voltage and the turn-off loss can be maintained.

In the semiconductor device 160 of the second comparative example, the changes in gate voltage Vg and CE voltage Vce during turn-on are further gentler than in the semiconductor device 100 of the present example. However, as described above, the CG capacitance is increased in the semiconductor device 160 of the second comparative example. The increased CG capacitance worsens the trade-off between the ON voltage and turn-off loss of the transistor section 70.

Figure 5A:
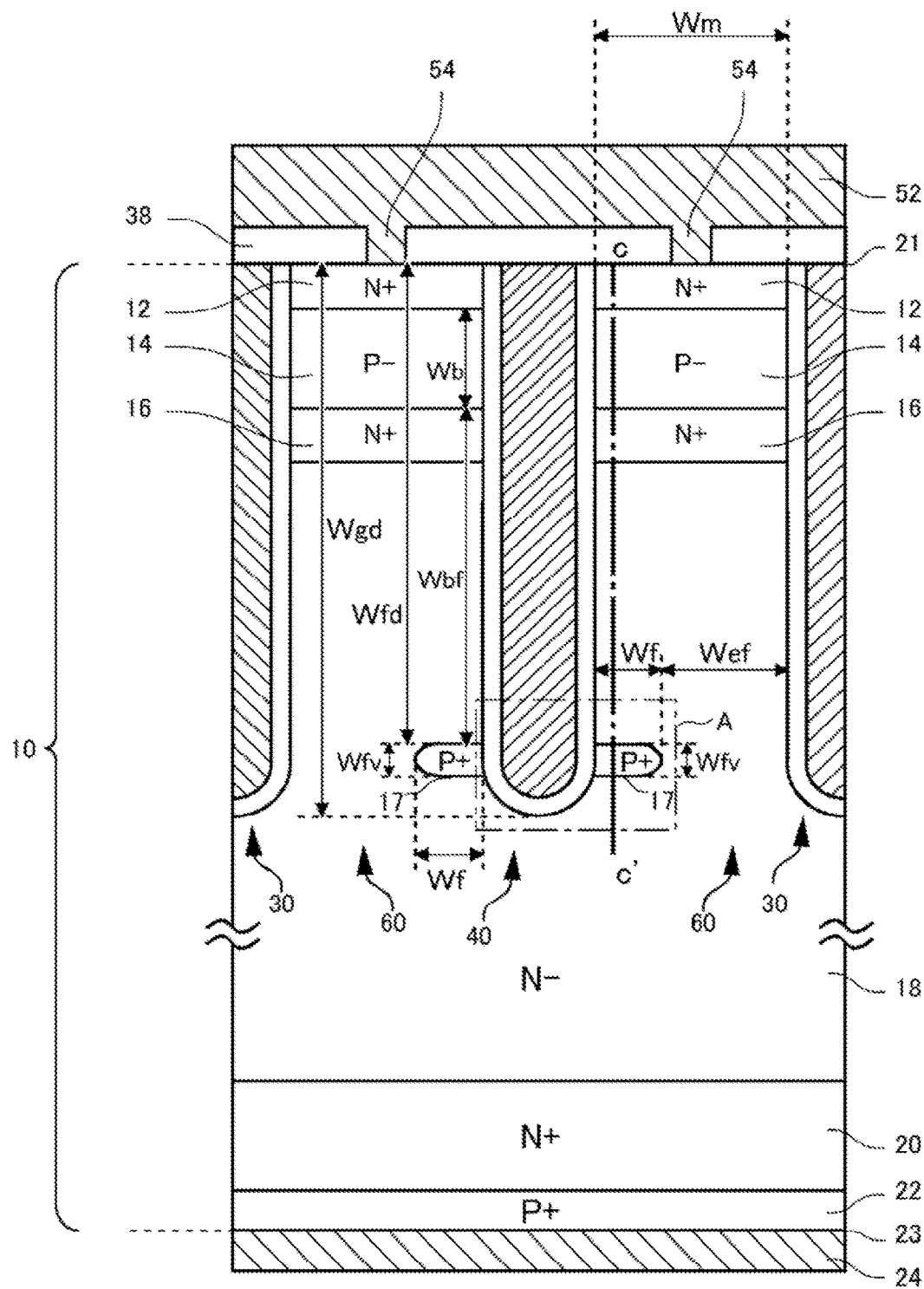

FIG. 5a shows an example of the cross section along b-b' in FIG. 1a. The cross section along b-b' is a Y-Z plane passing through emitter regions 12 in the transistor section 70. The semiconductor device 100 of the present example includes, in the cross section along b-b', the semiconductor substrate 10, the interlayer dielectric film 38, the emitter electrode 52 and the collector electrode 24. The emitter electrode 52 is provided on the upper surfaces of the interlayer dielectric film 38 and the semiconductor substrate 10.

The semiconductor device 100 of the present example includes, in the cross section along b-b', an emitter region 12 provided in contact with the upper surface 21. The emitter region 12 is in contact with a gate trench portion 40 in the Y-axis direction. A base region 14 is provided below the emitter region 12. The base region 14 is in contact with the gate trench portion 40 in the Y-axis direction. An accumulation region 16 is provided below the base region 14. The accumulation region 16 is in contact with the gate trench portion 40 in the Y-axis direction. The drift region 18 is provided below the accumulation region 16. The buffer region 20 is provided below the drift region 18. The collector region 22 is provided below the buffer region 20. The collector electrode 24 is provided on the lower surface 23.

The semiconductor device 100 of the present example includes a floating region 17 provided in contact with the gate trench portion 40. The floating region 17 may be provided below the accumulation region 16 and spaced apart from the accumulation region 16. At least a part of the floating region 17 in the depth direction of the semiconductor substrate 10 may be provided in contact with the bottom portion of the gate trench portion 40. The bottom portion of the gate trench portion 40 will be described in detail with reference to FIG. 5b.

Width Wgd is the Z-axis direction width from the upper surface 21 to the end of the bottom portion of the gate trench portion 40, that is, the depth of the gate trench portion 40 from the upper surface 21. Width Wfd is the Z-axis direction width from the upper surface 21 to the upper end of the floating region 17. Width Wb is the Z-axis direction width of the base region 14 in the transistor section 70. Width Wb may be the Z-axis direction width of the base region 14 at the position contacting the gate trench portion 40. Width Wbf is the Z-axis direction width from the lower end of the base region 14 to the upper end of the floating region 17. Width Wbf may be the Z-axis direction width from the lower end of the base region 14 to the lower end of the floating region 17 at the position contacting the gate trench portion 40.

Width Wm is the mesa width of the first mesa portion 60. Width Wm may be the mesa width of the first mesa portion 60 at the upper surface 21 of the semiconductor substrate 10. Width Wf is the Y-axis direction width of the floating region 17. Width Wf may be the maximum value of the Y-axis direction width of the floating region 17. Width Wef is the Y-axis direction width of the drift region 18 at the depth at which the floating region 17 is provided. Width Wef may be the Y-axis direction width from the Y-axis-direction end of the floating region 17 to the dummy trench portion 30. Width Wfv is the Z-axis direction width of the floating region 17, that is, the thickness of the floating region 17. Width Wfv may be the maximum value of the Z-axis direction width of the floating region 17. Width Wfv may also be the Z-axis direction width of the floating region 17 at the position contacting the gate trench portion 40. As an example, width Wfv is between 0.1 µm and 1.0 inclusive. Width Wfv may also be between 0.3 µm and 0.7 inclusive.

The floating region 17 is provided in a part of the first mesa portion 60 in the Y-axis direction. That is, Wf<Wm. In the example of FIG. 5a, the floating region 17 is provided over width Wf from the position contacting the gate trench portion 40 to a predetermined Y-axis direction position in the first mesa portion 60. The floating region 17 is not provided at a position farther from the gate trench portion 40 than the predetermined position.

Width Wbf may be larger than width Wb. By making width Wbf larger than width Wb, when the transistor section 70 is in the ON state, a depletion layer expanding in the depth direction of the semiconductor substrate 10 from the junction interface between the base region 14 and the drift region 18 becomes less prone to reach the floating region 17. Thus, in the semiconductor device 100 of the present example, electron current can flow in the vicinity of the center of the first mesa portion 60 without being blocked. Width Wbf may be twice or more width Wb. As an example, width Wbf is between 2.5 µm and 3.5 µm, inclusive.

Holes are accumulated in the floating region 17 at a high concentration. Thus, if the floating region 17 is provided in contact with the accumulation region 16 in the Z-axis direction, the holes accumulated in the floating region 17 easily pass through the accumulation region 16 in the upward direction. This lowers the IE effect of the accumulation region 16. In the semiconductor device 100 of the present example, the floating region 17 is spaced apart from the accumulation region 16 in the Z-axis direction, and thus the lowering of the IE effect can be reduced. This can reduce the increase in ON voltage Von of the transistor section 70.

Figure 5B:
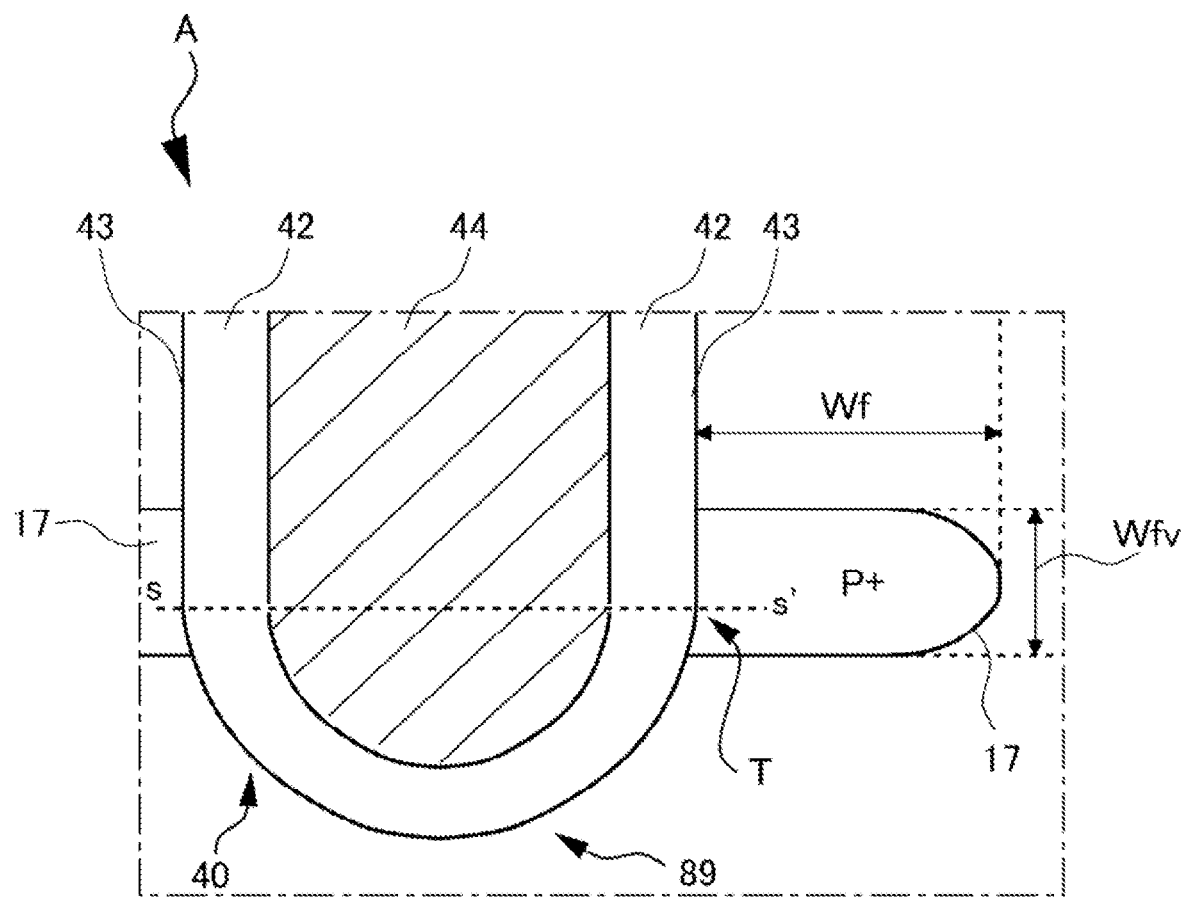
Figure 5B:

FIG. 5b is an enlarged view of region A in FIG. 5a. FIG. 5b shows the bottom portion, 89, of the gate trench portion 40 on an enlarged scale. In the present example, the bottom portion 89 of the gate trench portion 40 is a region in which the line indicating the cross-sectional outline of the gate trench portion 40 forms a curved line that is convex downward (in the negative Z-axis direction) in the Y-Z plane. That is, the bottom portion 89 of the gate trench portion 40 is the region of the gate trench portion 40 below line s-s' in the Y-axis direction in FIG. 5b. Line s-s' passes through singular point T. Singular point T is a point at which the cross-sectional shape of the side wall 43 of the gate trench portion 40 changes from an approximately straight line to a curved line. Singular point T may also be a point at which the slope of the side wall 43 begins to change. The bottom portion 89 of the gate trench portion 40 may also be defined as the region of 0.5 µm upward (in the positive Z-axis direction) from the lowest end of the gate trench portion 40, or the bottom portion 89 of the gate trench portion 40 may also be defined as the region of 0.1×Wgd upward from the lowest end of the gate trench portion 40.

At least a part of the floating region 17 in the depth direction of the semiconductor substrate 10 may be provided in contact with the bottom portion 89 of the gate trench portion 40. That is, the Z-axis direction position of the floating region 17 may be such that the upper end of the floating region 17 is above (i.e. closer to the upper surface 21 of the semiconductor substrate 10 than) line s-s' and the lower end of the floating region 17 is below (i.e. closer to the lower surface 23 of the semiconductor substrate 10 than) line s-s' in the Y-Z plane. The Z-axis direction position of the upper end of the floating region 17 may coincide with line s-s'. The Z-axis direction position of the lower end of the floating region 17 may coincide with line s-s'.

Figure 6A:
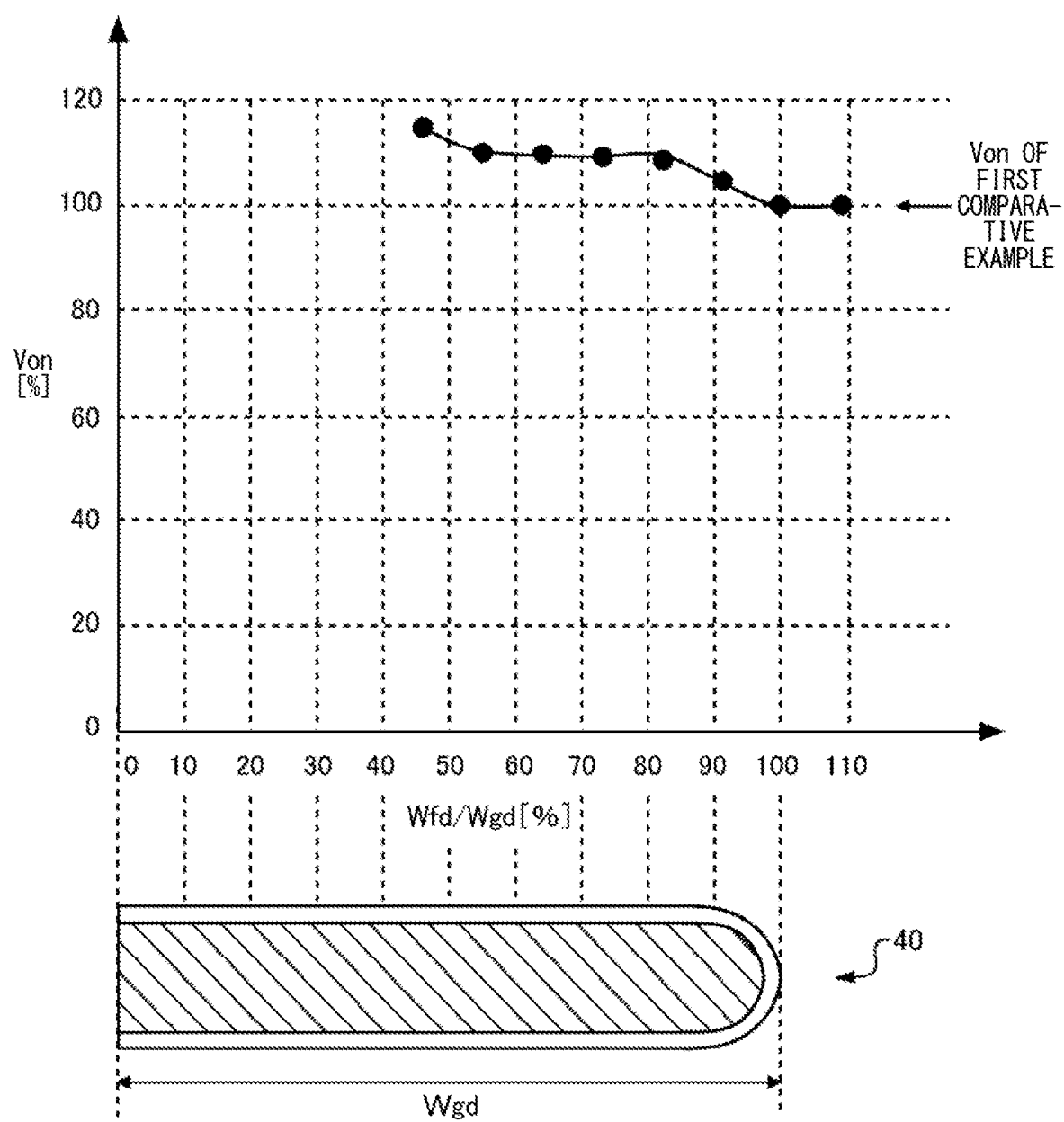
FIG. 6a shows an example of the relationship between width ratio Wfd/Wgd and ON voltage Von for the semiconductor device 100 according to the present example.

FIG. 6a shows an example of the relationship between width Wfd and ON voltage Von for the semiconductor device 100 according to the present example. In FIG. 6a, width Wfd is indicated as a ratio relative to width Wgd. That is, the horizontal axis in FIG. 6a indicates Wfd/Wgd [%]. Also, ON voltage Von of the semiconductor device 100 is indicated as a ratio relative to Von of the semiconductor device 150 of the first comparative example. That is, the vertical axis in FIG. 6a indicates Von of the semiconductor device 100/Von of the semiconductor device 150 [%]. In FIG. 6a, the position of the bottom portion 89 of the gate trench portion 40 is in a range in which width ratio Wfd/Wgd=90% to 100%. Width Wfv of the floating region 17 is a width corresponding to approximately 10% on the horizontal axis of FIG. 6a.

By arranging the floating region 17 in the vicinity of the bottom portion 89 of the gate trench portion 40, the increase in ON voltage Von relative to Von of the first comparative example can be reduced to less than 10%, as shown in FIG. 6a. As an example, at least a part of the floating region 17 in the Z-axis direction may be arranged at a depth contacting the bottom portion 89 of the gate trench portion 40. In this case, the remaining portion of the floating region 17 other than the part in the Z-axis direction may be arranged above the bottom portion 89 of the gate trench portion 40. The floating region 17 may also be arranged such that its entirety in the Z-axis direction is in contact with the bottom portion 89 of the gate trench portion 40.

Figure 6B:
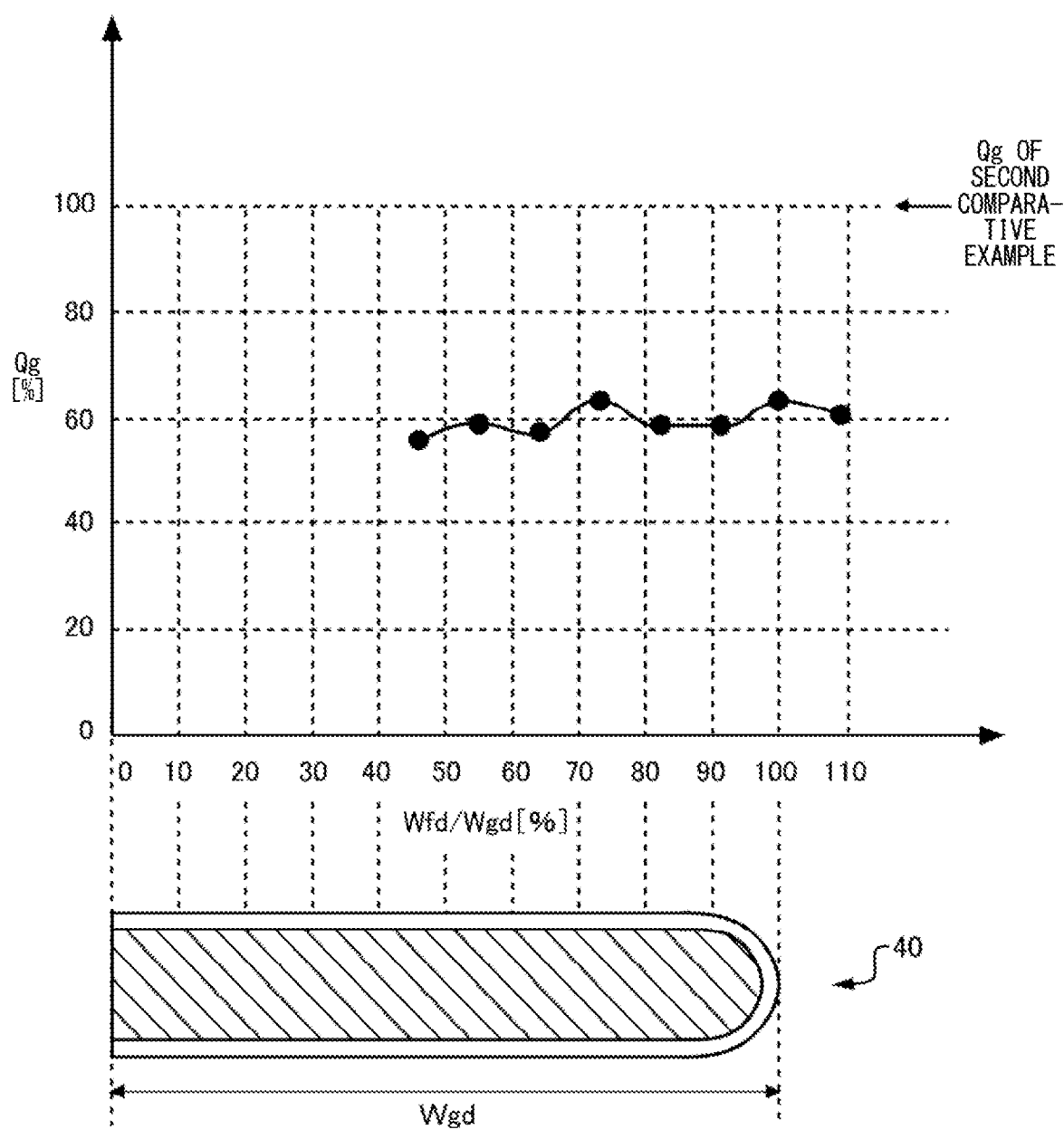
FIG. 6b shows an example of the relationship between width ratio Wfd/Wgd and charge Qg accumulated in the gate metal layer for the semiconductor device 100 according to the present example.

FIG. 6b shows an example of the relationship between width Wfd and Qg, the integral value of the gate current during turn-on (charge), for the semiconductor device 100 of the present example. The horizontal axis in FIG. 6b indicates Wfd/Wgd [%], in like manner with FIG. 6a. In FIG. 6b, charge Qg for the semiconductor device 100 is indicated as a ratio relative to charge Qg for the semiconductor device 160 of the second comparative example. That is, the vertical axis in FIG. 6b indicates Qg of the semiconductor device 100/Qg of the semiconductor device 160 [%].

In semiconductor devices, a larger value of Qg indicates a larger CG capacitance. As shown in FIG. 6b, whatever depth the floating region 17 is provided at, charge Qg for the semiconductor device 100 can be reduced by about 40% relative to Qg for the second comparative example. That is, the CG capacitance of the semiconductor device 100 can be reduced.

Figure 6C:
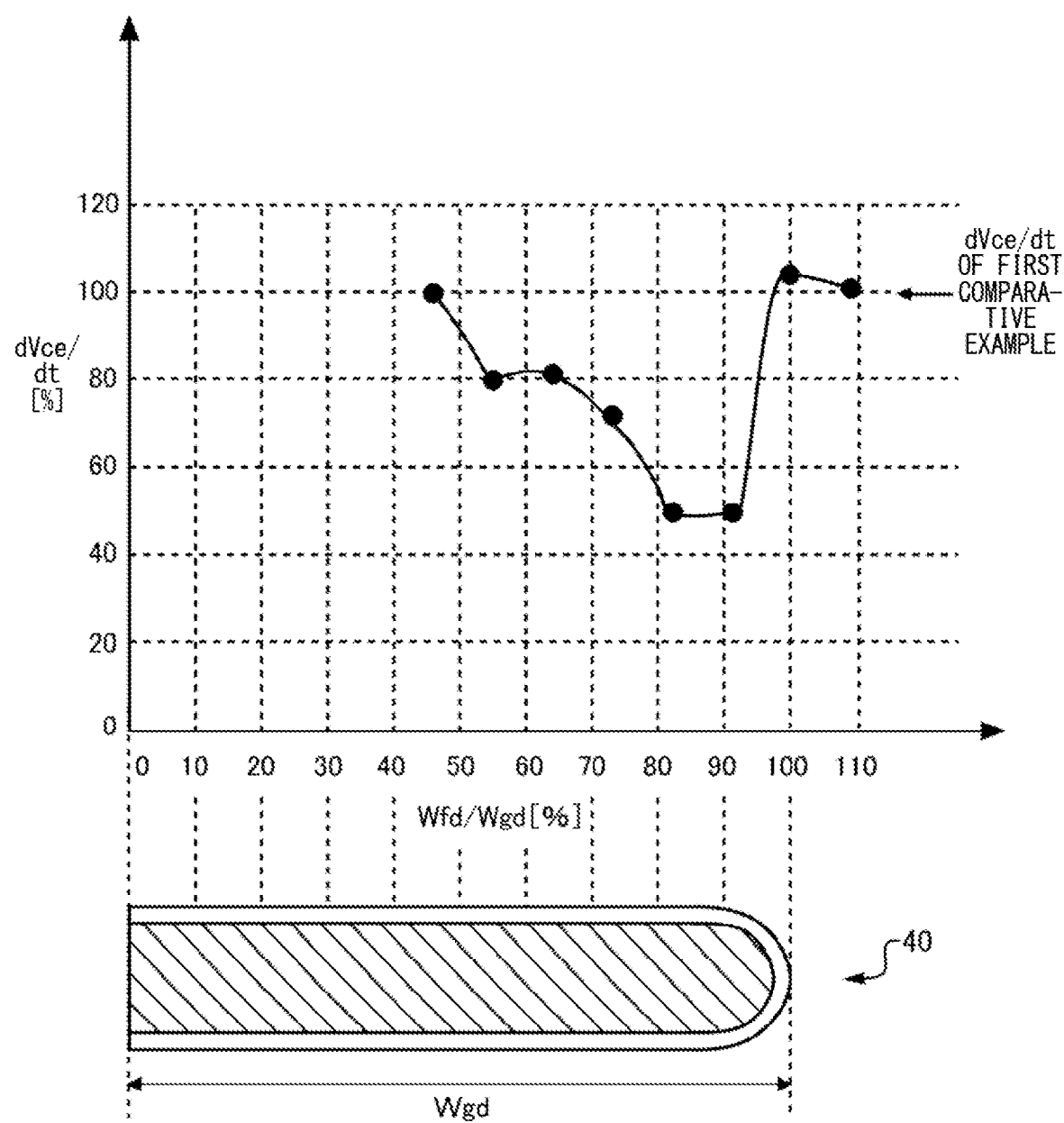
FIG. 6c shows an example of the relationship between width ratio Wfd/Wgd and the rate of decrease in CE voltage (dVce/dt) for the semiconductor device 100 according to the present example.

FIG. 6c shows an example of the relationship between width Wfd and the rate of decrease in CE voltage (dVce/dt) during turn-on for the semiconductor device 100 according to the present example. The horizontal axis in FIG. 6c indicates Wfd/Wgd [%], in like manner with FIG. 6a. In FIG. 6c, (dVce/dt) is indicated as a ratio relative to (dVce/dt) of the first comparative example. That is, the vertical axis in FIG. 6c indicates (dVce/dt) of the semiconductor device 100/(dVce/dt) of the semiconductor device 150 [%].

In the semiconductor device 100 of the present example, as shown in FIG. 6c, the voltage decrease rate (dVce/dt) indicates values of about 80% or more in the section in which Wfd/Wgd is smaller than about 70% (or 73%) and in the section in which Wfd/Wgd is larger than 95%. In contrast, dVce/dt is decreased in the section in which Wfd/Wgd is 70% or more (or 73% or more) and smaller than 100%. In particular, dVce/dt is abruptly decreased in the section in which Wfd/Wgd is 95% or less. Also, the voltage decrease rate (dVce/dt) takes a local minimum of about 50% in the range in which Wfd/Wgd is approximately from 80% to 92%. The range of Wfd/Wgd in which dVce/dt takes the local minimum approximately coincides with the range in which at least a part of the floating region 17 in the Z-axis direction is arranged at the bottom portion 89 of the gate trench portion 40.

Arranging the floating region 17 in the vicinity of the bottom portion 89 of the gate trench portion 40 allows electron current to easily flow through the center of the mesa portion. Thus, in the vicinity of the bottom portion 89 of the gate trench portion 40 where holes are accumulated, the region in which holes are distributed can be easily divided by the electron current, so that the displacement current is easily reduced. Thus, the voltage decrease rate (dVce/dt) can be reduced. As an example, as shown in FIG. 6c, the rate of decrease in CE voltage (dVce/dt) can be reduced by about 50% relative to the voltage decrease rate (dVce/dt) of the first comparative example.

When the floating region 17 is arranged at a deeper position than the bottom portion 89 of the gate trench portion 40 (in a region where Wfd/Wgd is larger than 100% in FIG. 6c), the gate trench portion 40 and the floating region 17 are spaced apart, and electron current flows between the gate trench portion 40 and the floating region 17. In this case, the displacement current cannot be reduced. Thus, as shown in FIG. 6c, by making Wfd/Wgd larger than 100%, the voltage decrease rate (dVce/dt) of the semiconductor device 100 is abruptly increased and indicates substantially the same value as the voltage decrease rate (dVce/dt) of the first comparative example. Consequently, providing at least a part of the floating region 17 in the Z-axis direction in contact with the bottom portion 89 of the gate trench portion 40 can significantly improve the rate of decrease in CE voltage.

Consequently, Wfd/Wgd may be 70% or more and less than 100%. Further, Wfd/Wgd may be 73% or more, or may be 80% or more. Wfd/Wgd may be 95% or less, or may be 92% or less.

Figure 7:
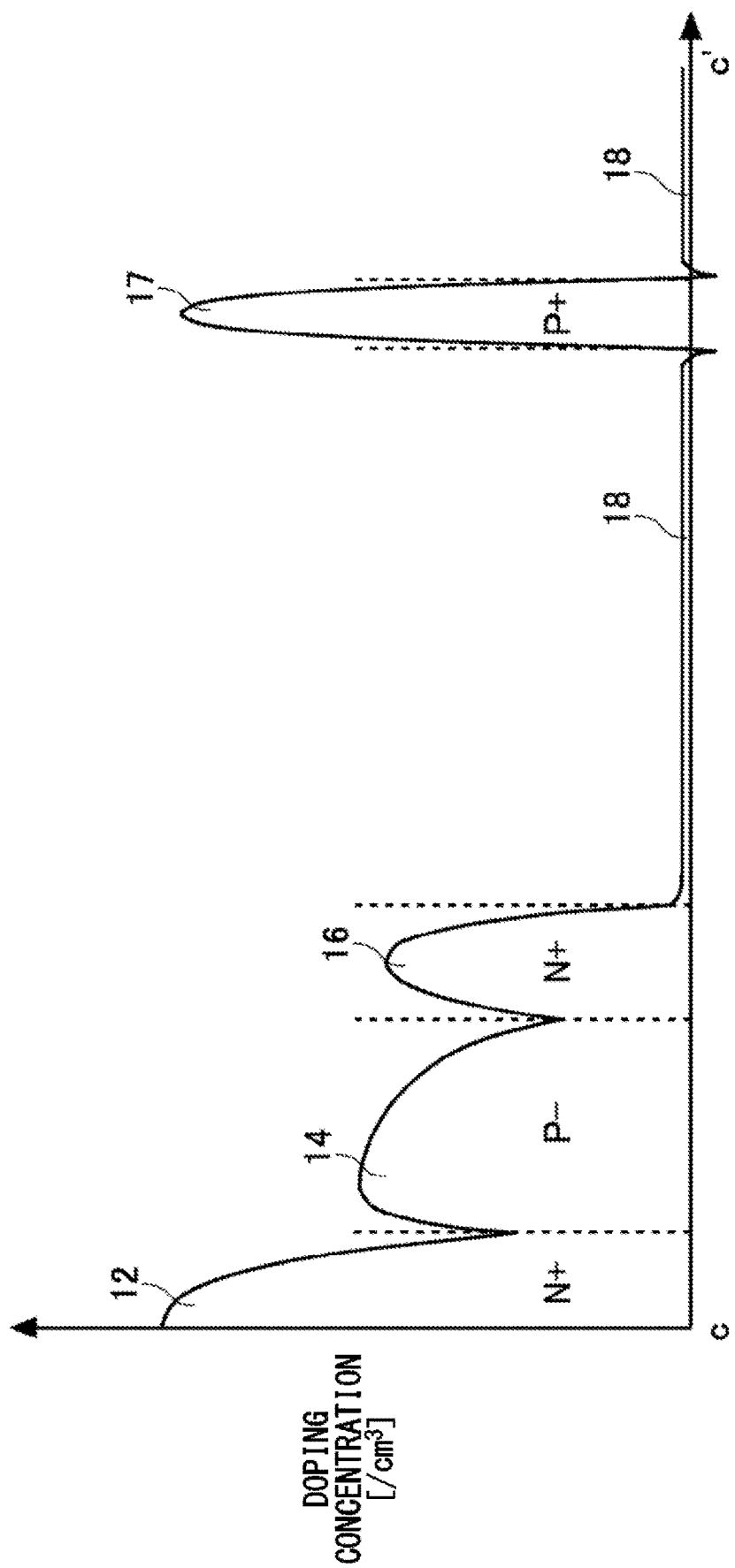

FIG. 7 shows an example of doping concentration distribution in the cross section along c-c' in FIG. 5a. In FIG. 7, the vertical axis is a logarithmic axis and the horizontal axis is a linear axis. As shown in FIG. 7, in the semiconductor device 100 of the present example, the doping concentration of the floating region 17 may be higher than the doping concentration of the accumulation region 16. The doping concentration of the floating region 17 may be higher by a factor of 10 or more, or higher by 100 or more than the doping concentration of the accumulation region 16. As an example, the doping concentration of the accumulation region 16 is $1 \times 10^{17}/cm^3$. The doping concentration of the floating region 17 may be a concentration of $1 \times 10^{19}/cm^3$ or more.

As shown in FIG. 7, in the semiconductor device 100 of the present example, the doping concentration of the floating region 17 may be higher than the doping concentration of the base region 14. The doping concentration of the floating region 17 may be higher by a factor of 10 or more, or higher by 100 or more than the doping concentration of the base region 14. As an example, the doping concentration of the base region 14 is $3 \times 10^{17}/cm^3$. The doping concentration of the floating region 17 may be a concentration of $1 \times 10^{19}/cm^3$ or more.

Figure 8A:
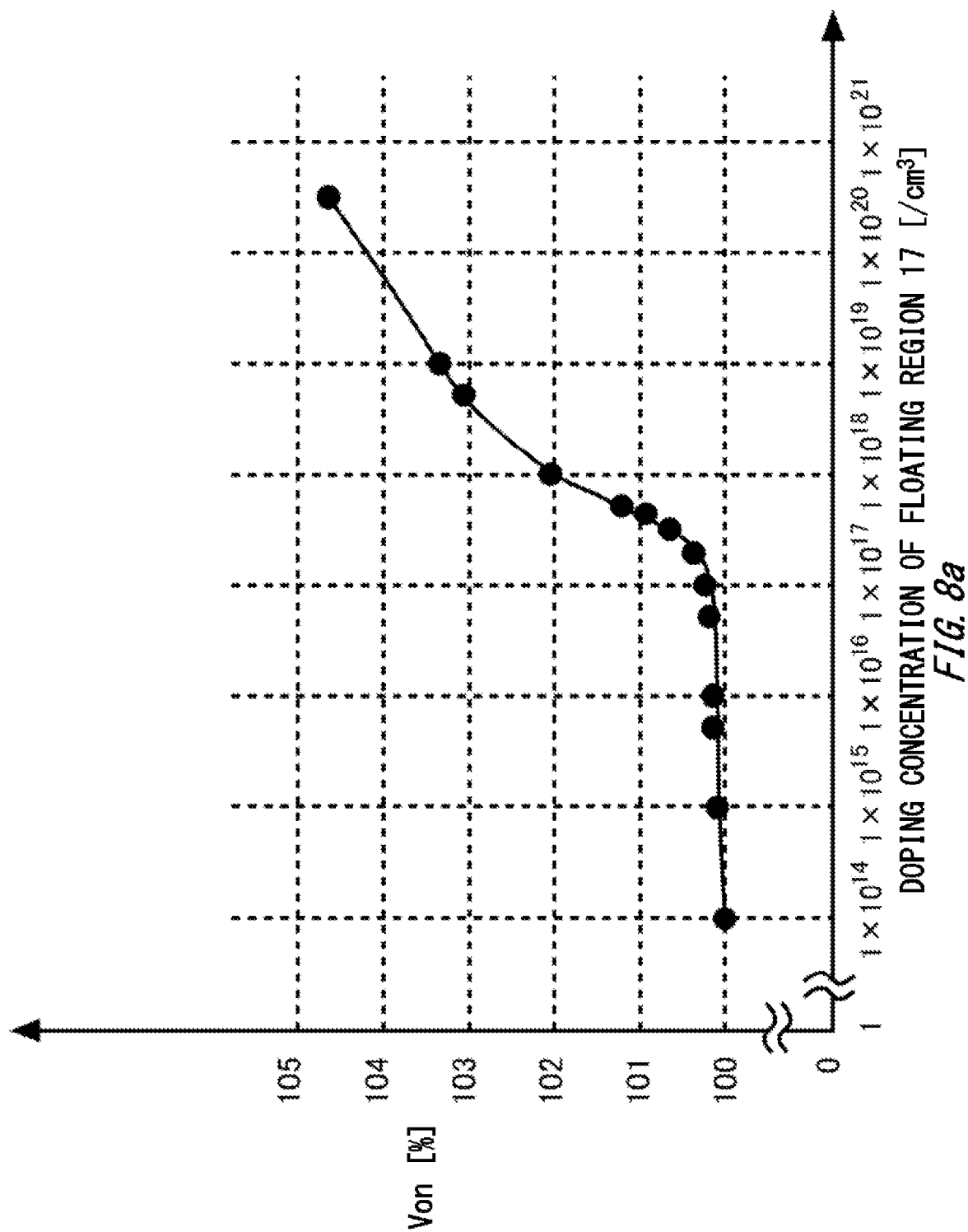
FIG. 8a shows an example of the relationship between the doping concentration of a floating region 17 and ON voltage Von for the semiconductor device 100 according to the present example.

FIG. 8a shows an example of the relationship between the doping concentration of the floating region 17 and ON voltage Von for the semiconductor device 100 according to the present example. In FIG. 8a, at least a part of the floating region 17 in the Z-axis direction is provided in contact with the bottom portion 89 of the gate trench portion 40. In FIG. 8a, ON voltage Von for each value of the concentration of the floating region 17 is indicated as a ratio relative to ON voltage Von for the concentration of the floating region 17 being $1 \times 10^{14}/cm^3$. That is, the vertical axis in FIG. 8a indicates ON voltage Von/(ON voltage Von for the concentration of the floating region 17 being $1 \times 10^{14}/cm^3$) [%].

As shown in FIG. 8a, ON voltage Von of the semiconductor device 100 of the present example begins to increase when the doping concentration of the floating region 17 exceeds $1 \times 10^{17}/cm^3$. Von indicates 104% to 105% when the doping concentration is between $1 \times 10^{20}/cm^3$ and $1 \times 10^{21}/cm^3$. That is, the increase in ON voltage Von can be reduced to less than 5% even when the doping concentration of the floating region 17 is increased by $10^3$ times to $10^4$ times. Thus, it may be considered that ON voltage Von of the semiconductor device 100 of the present example is substantially free from the effect of the doping concentration of the floating region 17.

Figure 8B:
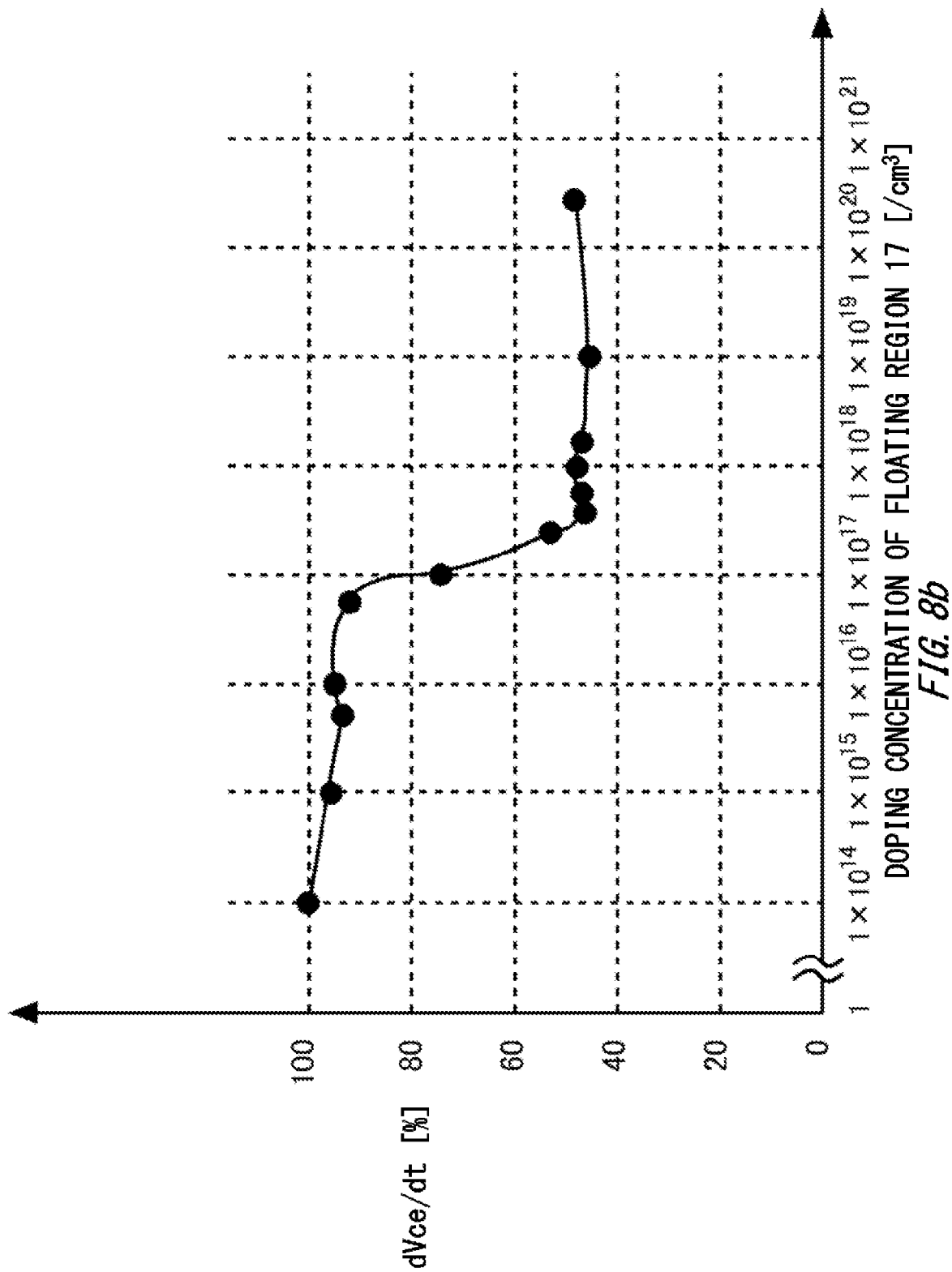
FIG. 8b shows an example of the relationship between the doping concentration of the floating region 17 and the rate of decrease in CE voltage (dVce/dt) for the semiconductor device 100 according to the present example.

FIG. 8b shows an example of the relationship between the doping concentration of the floating region 17 and the rate of decrease in CE voltage (dVce/dt) for the semiconductor device 100 according to the present example. In FIG. 8b, at least a part of the floating region 17 in the Z-axis direction is provided in contact with the bottom portion 89 of the gate trench portion 40. In FIG. 8b, the rate of decrease in CE voltage (dVce/dt) for each value of the concentration of the floating region 17 is indicated as a ratio relative to the rate of decrease in CE voltage (dVce/dt) for the concentration of the floating region 17 being $1 \times 10^{14}/cm^3$. That is, the vertical axis in FIG. 8b indicates the rate of decrease in CE voltage (dVce/dt)/the rate of decrease in CE voltage (dVce/dt) for the concentration of the floating region 17 being $1\times10^{14}/cm^3$ [%].

As shown in FIG. 8b, the rate of decrease in CE voltage (dVce/dt) of the semiconductor device 100 of the present example begins to decrease when the doping concentration of the floating region 17 exceeds $1\times10^{16}/cm^3$, or particularly $8\times10^{16}/cm^3$. When the doping concentration reaches $3\times10^{17}/cm^3$, the rate of decrease in CE voltage (dVce/dt) indicates about 55% of the rate of decrease in CE voltage (dVce/dt) for the doping concentration being $1\times10^{14}/cm^3$. Further, when the doping concentration exceeds $1\times10^{18}/cm^3$, the rate of decrease in CE voltage (dVce/dt) indicates about 50% of the rate of decrease in CE voltage (dVce/dt) for the doping concentration being $1\times10^{14}/cm^3$. That is, in the semiconductor device 100 of the present example, the rate of decrease in CE voltage (dVce/dt) can be significantly reduced by setting the doping concentration of the floating region 17 to $1\times10^{18}/cm^3$ or more.

The doping concentration of the floating region 17 may be $8\times10^{16}/cm^3$ or more, may be $3\times10^{17}/cm^3$ or more, may be $1\times10^{18}/cm^3$ or more, or may be $1\times10^{19}/cm^3$ or more. The doping concentration of the floating region 17 may be $3\times10^{20}/cm^3$ or less.

Meanwhile, in order to reduce the increase in ON voltage to about 3% or less, the upper limit of the doping concentration of the floating region 17 may be set to $1\times10^{19}/cm^3$ or less (or less than $1\times10^{19}/cm^3$), as can be seen from FIG. 8a. In this case, the lower limit of the doping concentration of the floating region 17 may be $1\times10^{17}/cm^3$, as can be seen from FIG. 8a.

Figure 9A:
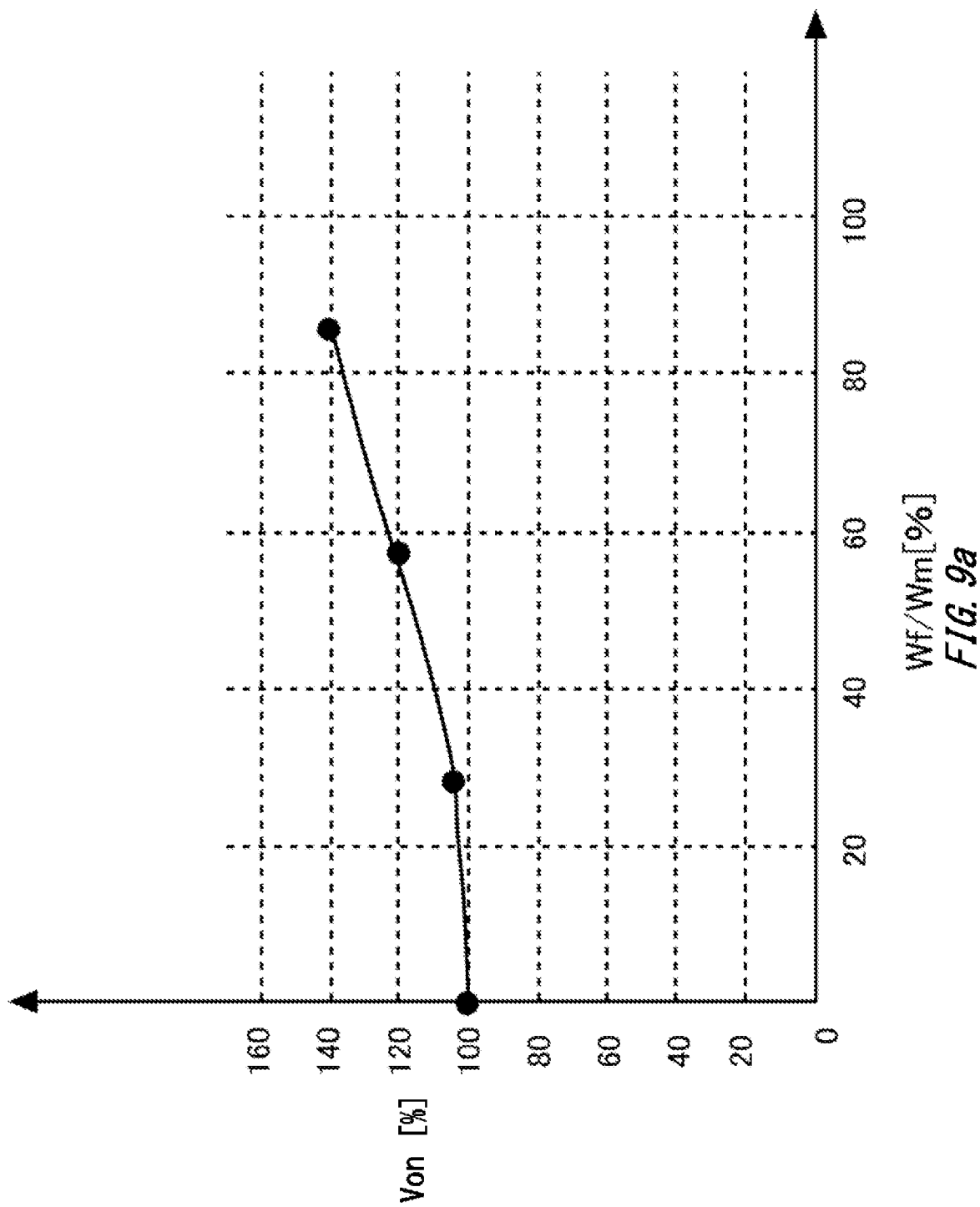
FIG. 9a shows an example of the relationship between the ratio of width Wf relative to width Wm (Wf/Wm) and ON voltage Von for the semiconductor device 100 according to the present example.

FIG. 9a shows an example of the relationship between the ratio of width Wf relative to width Wm (Wf/Wm [%]) and ON voltage Von for the semiconductor device 100 according to the present example. FIG. 9a shows the relationship between (Wf/Wm [%]) and ON voltage Von when at least a part of the floating region 17 in the Z-axis direction is provided in contact with the bottom portion 89 of the gate trench portion 40. That (Wf/Wm) is 0% means that Wf is zero, that is, the floating region 17 is not provided. Also, that (Wf/Wm) is 100% means that the floating region 17 is provided over the entire mesa width. In FIG. 9a, ON voltage Von is indicated as a ratio relative to ON voltage Von for (Wf/Wm) being 0%. That is, the vertical axis in FIG. 9a indicates ON voltage Von/ON voltage Von for (Wf/Wm) being 0% [%].

When (Wf/Wm) is about 60%, ON voltage Von is increased by about 20% relative to when (Wf/Wm) being 0%. When (Wf/Wm) is about 85%, ON voltage Von is increased by about 40% relative to when (Wf/Wm) is 0%. When (Wf/Wm) is between 10% and 50%, inclusive, that is, width Wf is between 0.1 times and 0.5 times, inclusive, of mesa width Wm, the increase in ON voltage Von can be reduced to less than 20%.

FIG. 9b shows an example of the relationship between the ratio of width Wf relative to width Wm (Wf/Wm [%]) and charge Qg accumulated in the gate metal layer for the semiconductor device 100 according to the present example. FIG. 9b shows the relationship between (Wf/Wm [%]) and charge Qg when at least a part of the floating region 17 in the Z-axis direction is provided in contact with the bottom portion 89 of the gate trench portion 40. In FIG. 9b, charge Qg is indicated as a ratio relative to charge Qg for (Wf/Wm) being 0%. That is, the vertical axis in FIG. 9b indicates charge Qg/charge Qg for (Wf/Wm) being 0% [%].

When (Wf/Wm) is about 60%, charge Qg is decreased by about 5% relative to when (Wf/Wm) is 0%. When (Wf/Wm) exceeds about 60%, charge Qg has a tendency to be increased. That is, charge Qg indicates a local minimum value when (Wf/Wm) is about 60%. Consequently, it is apparent that charge Qg accumulated at the gate metal layer of the semiconductor device 100 of the present example can be reduced by providing the floating region 17.

Figure 9C:
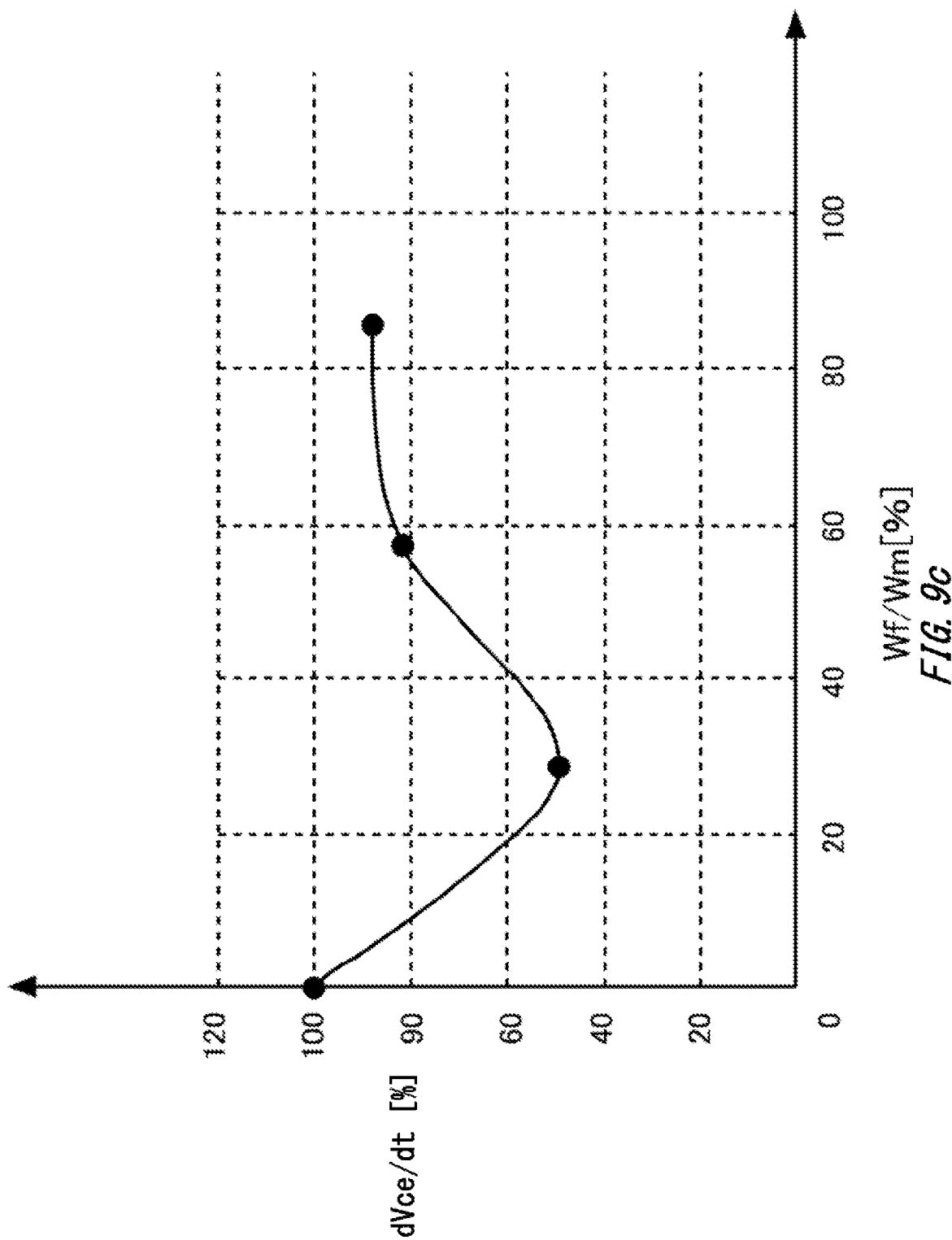
FIG. 9c shows an example of the relationship between the ratio of width Wf relative to width Wm (Wf/Wm) and the rate of decrease in CE voltage (dVce/dt) for the semiconductor device 100 according to the present example.

FIG. 9c shows an example of the relationship between the ratio of width Wf relative to width Wm (Wf/Wm [%]) and the rate of decrease in CE voltage (dVce/dt) for the semiconductor device 100 according to the present example. FIG. 9c shows the relationship between (Wf/Wm [%]) and the rate of decrease in CE voltage (dVce/dt) when at least a part of the floating region 17 in the Z-axis direction is provided in contact with the bottom portion 89 of the gate trench portion 40. In FIG. 9c, the rate of decrease in CE voltage (dVce/dt) is indicated as a ratio relative to the rate of decrease in CE voltage (dVce/dt) for (Wf/Wm) being 0%. That is, the vertical axis in FIG. 9c indicates the rate of decrease in CE voltage (dVce/dt)/the rate of decrease in CE voltage (dVce/dt) for (Wf/Wm) being 0% [%].

In the semiconductor device 100 of the present example, the rate of decrease in CE voltage (dVce/dt) indicates a local minimum value when (Wf/Wm) is about 30%. When (Wf/Wm) is about 30%, the rate of decrease in CE voltage (dVce/dt) can be reduced to about 50% relative to when (Wf/Wm) is 0%. As described with reference to FIG. 3, providing the floating region 17 allows electron current to flow along the path from the vicinity of the gate trench portion 40 to the vicinity of the center of the first mesa portion 60. The electron current flowing in the vicinity of the center of the first mesa portion 60 divides the hole distribution, reducing the displacement current. Thus, the rate of decrease in CE voltage (dVce/dt) can be reduced.

If (Wf/Wm) is excessively small (for example, smaller than 10%), electron current does not sufficiently flow in the central vicinity and the hole distribution is not sufficiently divided, the rate of decrease in CE voltage (dVce/dt) is not sufficiently reduced. Conversely but similarly, if (Wf/Wm) is excessively large (for example, larger than 60%), electron current does not sufficiently flow in the central vicinity and the hole distribution is not sufficiently divided, the rate of decrease in CE voltage (dVce/dt) is not sufficiently reduced. When (Wf/Wm) is about 30%, electron current can flow in the central vicinity, so that the hole distribution is divided and the rate of decrease in CE voltage (dVce/dt) indicates the local minimum value. For this reason, (Wf/Wm) is preferably between 10% and 60%, inclusive. (Wf/Wm) may be 20% or more, or may be 25% or more. (Wf/Wm) may be 50% or less, may be 40% or less, or may be 35% or less.

Width Wf is preferably smaller than width Wef. Width Wf may be between 11% (⅑) of width Wef and 50% of width Wef, inclusive. Width Wf may be between 0.07 μm and 0.35 μm, inclusive.

Figure 10:
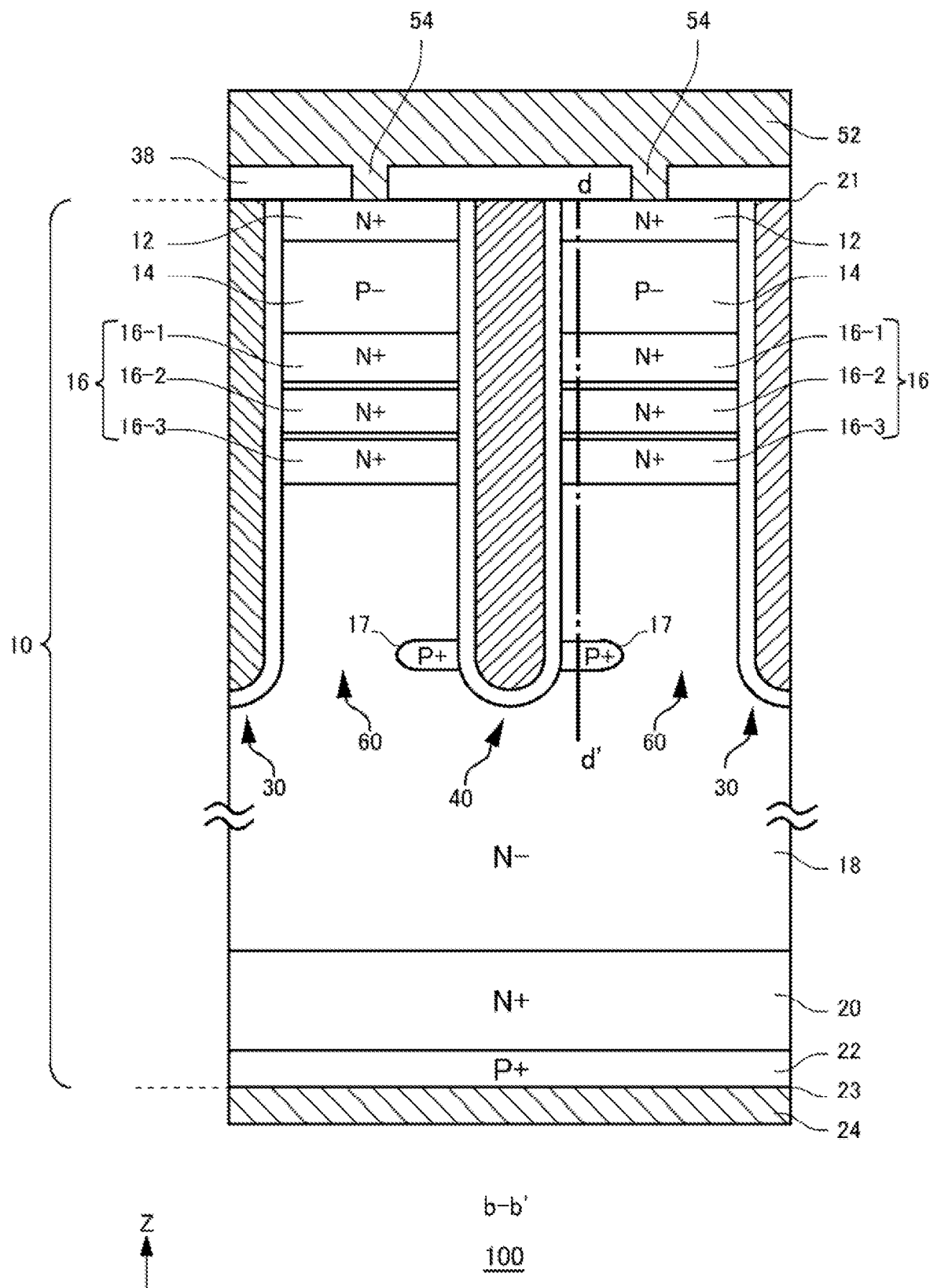
FIG. 10 shows another example of the cross section along b-b' in FIG. 1.

FIG. 10 shows another example of the cross section along b-b' in FIG. 1a. The semiconductor device 100 shown in FIG. 10 is different from the semiconductor device 100 shown in FIG. 5a in that a plurality of accumulation regions 16 are provided along the depth direction of the semiconductor substrate 10. Structures other than the accumulation regions 16 may be the same as those of the semiconductor device 100 described with reference to FIG. 5a. The semiconductor device 100 of the present example includes an accumulation region 16-1, an accumulation region 16-2 and an accumulation region 16-3, arranged along the depth direction. The drift region 18 may be provided in the respective regions sandwiched between the accumulation region 16-1 and the accumulation region 16-2 in the Z-axis direction and sandwiched between the accumulation region 16-2 and the accumulation region 16-3 in the Z-axis direction.

In a first mesa portion 60, a floating region 17 is provided below the third accumulation region 16-3. The floating region 17 is in contact with a gate trench portion 40. The floating region 17 is provided in only a part of the first mesa portion 60 in the Y-axis direction. That is, the floating region 17 is not provided over the entire width of the first mesa portion 60 in the Y-axis direction, but is provided over a partial region thereof in the Y-axis direction. In the example of FIG. 10, the floating region 17 is provided continuously from the position contacting the gate trench portion 40 to a predetermined Y-axis direction position within the first mesa portion 60, and is not provided at a position farther from the gate trench portion 40 than the predetermined position.

Figure 11:
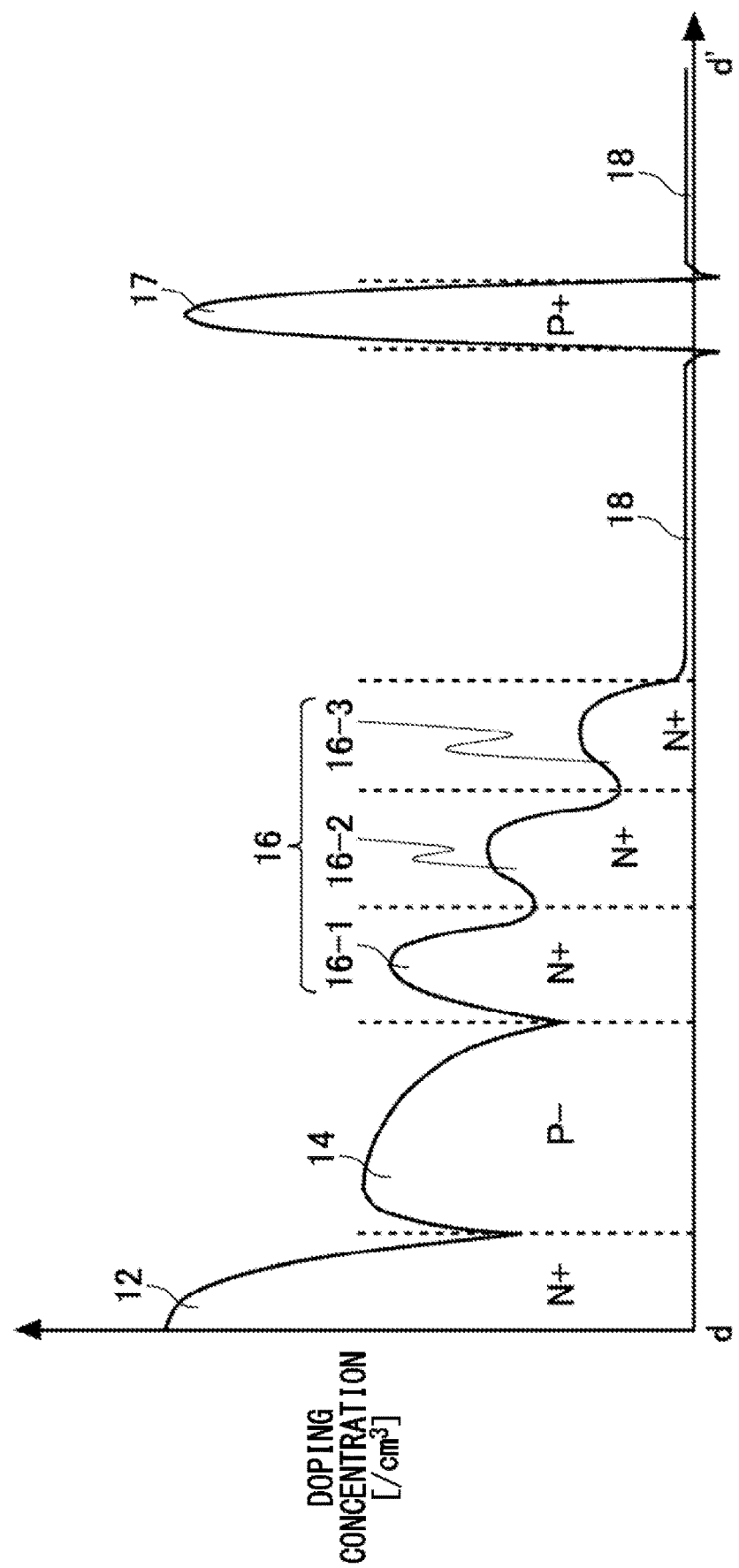
FIG. 11 shows an example of doping concentration distribution in the cross section along d-d' in FIG. 10.

FIG. 11 shows an example of doping concentration distribution in the cross section along d-d' in FIG. 10. As shown in FIG. 11, in the semiconductor device 100 of the present example, the doping concentration of the third accumulation region 16-3 provided at the lowest position may be lower than the doping concentration of the first accumulation region 16-1 arranged at the uppermost position. The doping concentrations of the first accumulation region 16-1, the second accumulation region 16-2 and the third accumulation region 16-3 may decrease toward the third accumulation region 16-3 arranged at the lower position.

The doping concentration of the second accumulation region 16-2 may be between ⅓ and ⅔, inclusive, of the doping concentration of the first accumulation region 16-1. The doping concentration of the third accumulation region 16-3 may be 1/10 or more of the doping concentration of the first accumulation region 16-1. The doping concentration of the third accumulation region 16-3 may be 3/10 or less of the doping concentration of the first accumulation region 16-1. The doping concentration of the first accumulation region 16-1 may be between $8 \times 10^{16}/cm^3$ and $2 \times 10^{17}/cm^3$, inclusive. As an example, the doping concentration of the first accumulation region 16-1 is $1 \times 10^{17}/cm^3$. The doping concentration of the second accumulation region 16-2 may be between $3 \times 10^{16}/cm^3$ and $7 \times 10^{16}/cm^3$, inclusive. As an example, the doping concentration of the second accumulation region 16-2 is $5 \times 10^{16}/cm^3$. The doping concentration of the third accumulation region 16-3 may be between $1 \times 10^{16}/cm^3$ and $3 \times 10^{16}/cm^3$, inclusive. As an example, the doping concentration of the third accumulation region 16-3 is $2 \times 10^{16}/cm^3$.

In the semiconductor device 100 of the present example, the doping concentrations of the accumulation regions 16 decrease toward the third accumulation region 16-3 arranged at the lower position. Thus, in the semiconductor device 100, the increase in CG capacitance can be reduced relative to when the first accumulation region 16-1, the second accumulation region 16-2 and the third accumulation region 16-3 are provided to have substantially equal doping concentrations, or to have doping concentration increasing toward the third accumulation region 16-3 arranged at the lower position.

In the semiconductor device 100 of the present example, the floating region 17 is provided below the third accumulation region 16-3, and thus electron current flows in the vicinity of the center of the first mesa portion 60 as shown in FIG. 3. Also, the hole distribution is divided at the vicinity of the center of the first mesa portion 60, and thus the displacement current generated due to the charging of the gate conductive portion 44 can be reduced. Thus, the rate of decrease in CE voltage (dVce/dt) can be reduced. That is, in the semiconductor device 100 of the present example, the increase in CG capacitance can be reduced while reducing the rate of decrease in CE voltage (dVce/dt). Thus, in the semiconductor device 100 of the present example, the turn-on loss can be reduced while reducing the rate of decrease in CE voltage (dVce/dt). Also, the trade-off between the ON voltage and the turn-off loss can be maintained.

Figure 12A:
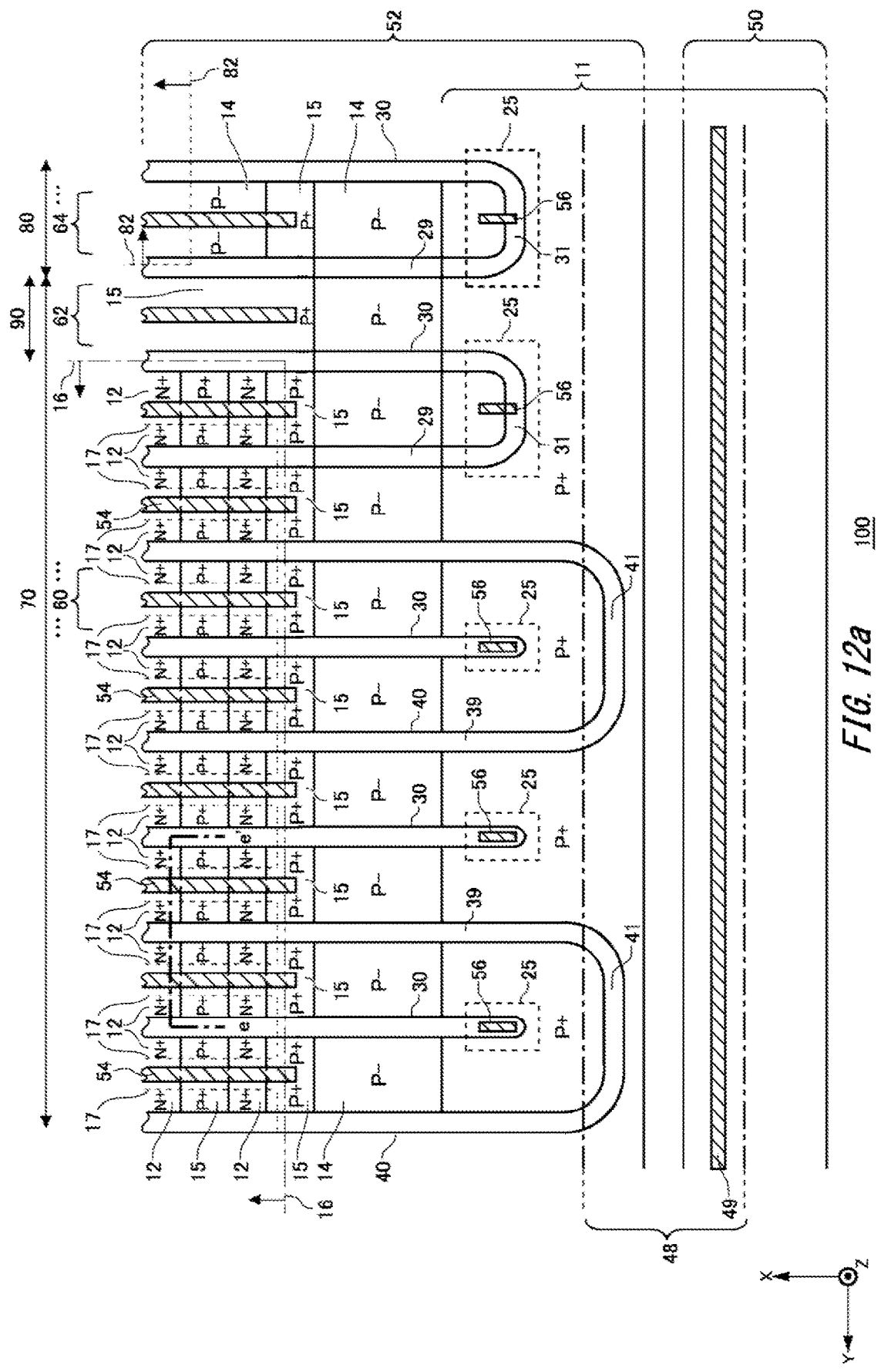
FIG. 12a shows a partial view of another example of the upper surface of the semiconductor device 100 according to the present embodiment.

FIG. 12a shows a partial view of another example of the upper surface of the semiconductor device 100 according to the present embodiment. The semiconductor device 100 shown in FIG. 12a is different from the semiconductor device 100 shown in FIG. 1a in that, as compared with the semiconductor device 100 of shown in FIG. 1a, floating regions 17 are additionally provided in contact with the dummy trench portions 30 below the accumulation regions 16 in the first mesa portions 60 of the transistor section 70. In FIG. 12a, the region in which the floating regions 17 are provided in top view of the semiconductor substrate 10 is indicated by dashed lines.

As shown in FIG. 12a, a floating region 17 is provided in a part of a first mesa portion 60 in the array direction (Y-axis direction). That is, the floating region 17 is not provided over the entire width of the first mesa portion 60 in the Y-axis direction, but is provided over a partial region thereof in the Y-axis direction. In the example of FIG. 12a, in the first mesa portion 60, the floating region 17 is provided continuously from the position contacting a dummy trench portion 30 to a predetermined Y-axis direction position within the first mesa portion 60. Also, in the first mesa portion 60, the floating region 17 is provided continuously from the position contacting a gate trench portion 40 to a predetermined Y-axis direction position within the first mesa portion 60. The end position of the floating region 17 contacting the gate trench portion 40 is different in the Y-axis direction from the end position of the floating region 17 contacting the dummy trench portion 30. Another floating region 17 is not provided between the two floating regions 17 in the Y-axis direction.

The positions of the Y-axis-direction ends of each floating region 17 may or may not overlap with the contact hole 54 in top view of the semiconductor substrate. FIG. 12a shows an example where both of the end positions of each floating region 17 do not overlap with the contact hole 54.

The floating region 17 contacting the dummy trench portion 30 may be provided continuously from one of the contact regions 15 provided at both X-axis-direction ends of the first mesa portion 60 to the other. As described above, the floating region 17 may be provided in contact with dummy trench portion 30.

The positions of both X-axis-direction ends of the floating region 17 contacting the dummy trench portion 30 may coincide with or different from the positions of both X-axis-direction ends of the accumulation region 16. FIG. 12a shows a case where the X-axis-direction end of the floating region 17 contacting the dummy trench portion 30 and the X-axis-direction end of the accumulation region 16 are at different positions.

FIG. 12b shows an example of the cross section along e-e' in FIG. 12a. The floating region 17 is provided in a part of the first mesa portion 60 in the Y-axis direction. That is, Wf<Wm. In the example of FIG. 12b, a floating region 17 contacting a dummy trench portion 30 is provided over width Wf from the position contacting the dummy trench portion 30. Another floating region 17 contacting a gate trench portion 40 is provided over width Wf from the position contacting the gate trench portion 40.

The floating region 17 provided in contact with the dummy trench portion 30 is spaced apart, in the Y-axis direction, from the floating region 17 provided in contact with the gate trench portion 40. That is, the floating region 17 contacting the dummy trench portion 30 and the other floating region 17 contacting the gate trench portion 40, provided in the same first mesa portion 60, are not in contact with each other in the first mesa portion 60.

The floating region 17 contacting the dummy trench portion 30 may be provided at substantially the same depth as the other floating region 17 contacting the gate trench portion 40. The drift region 18 may be provided in the region sandwiched between the floating region 17 contacting the dummy trench portion 30 and the floating region 17 contacting the gate trench portion 40 in the Y-axis direction.

In the semiconductor device 100 of the present example, the floating region 17 provided in contact with the dummy trench portion 30 is spaced apart, in the Y-axis direction, from the floating region 17 provided in contact with the gate trench portion 40, and thus electron current flows in the vicinity of the center of the first mesa portion 60 at the depth of the floating regions 17 due to a similar effect to that in FIG. 3. As the electron current flows in the vicinity of the center of the first mesa portion 60, the hole distribution in the vicinity of the bottom portion of the first mesa portion 60 is divided at the vicinity of the center of the first mesa portion 60, so that the accumulation of holes at the lower end of the gate trench portion 40 is reduced. Thus, the displacement current can be reduced. Thus, the rate of decrease in CE voltage (dVce/dt) can be reduced.

Figure 12C:
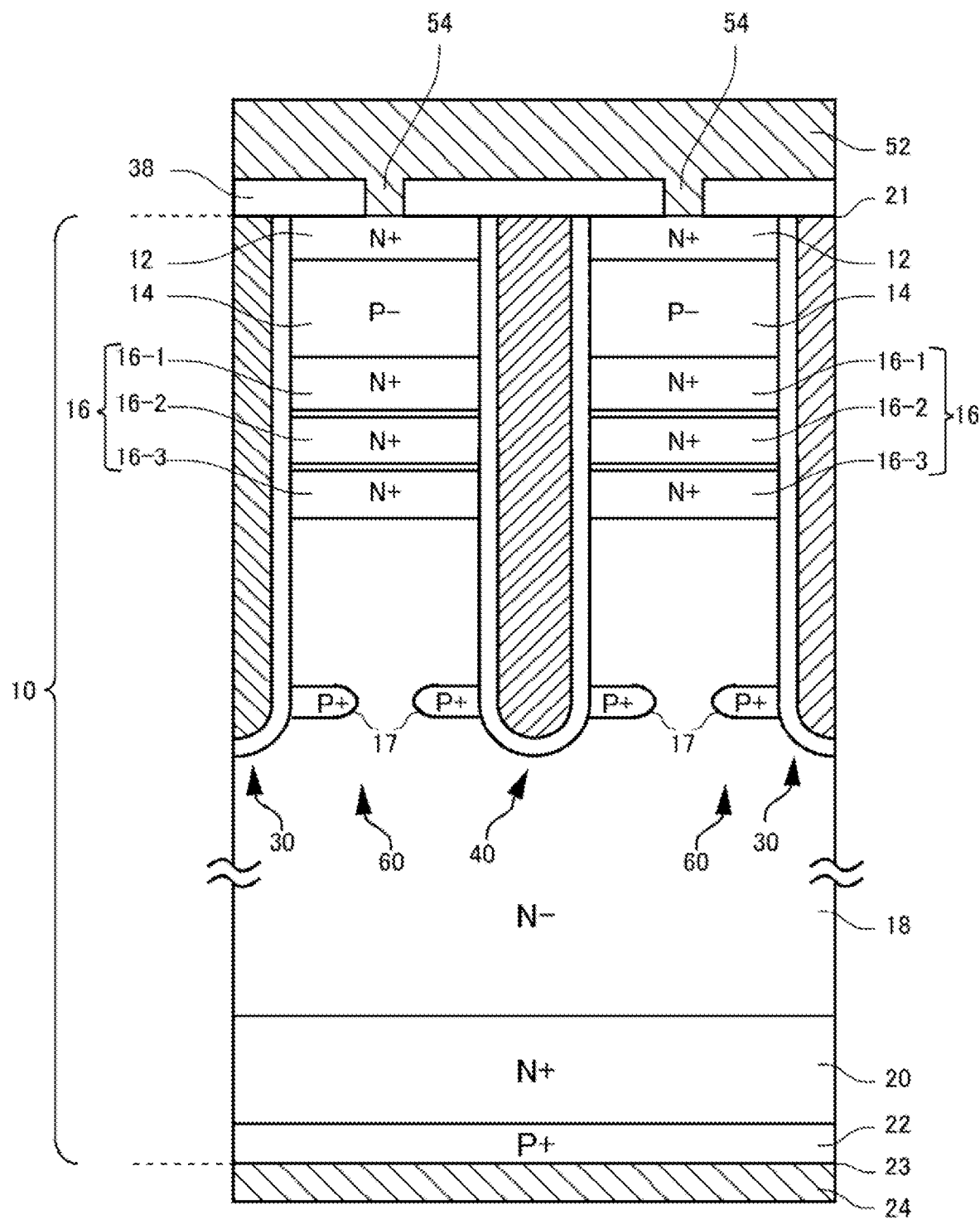
FIG. 12c shows another example of the cross section along e-e' in FIG. 12.

FIG. 12c shows another example of the cross section along e-e' in FIG. 12a. The semiconductor device 100 shown in FIG. 12c is different from the semiconductor device 100 shown in FIG. 12b in that, as compared with the semiconductor device 100 shown in FIG. 12b, a plurality of accumulation regions 16 are provided. The drift region 18 may be provided in the respective regions sandwiched between the accumulation region 16-1 and the accumulation region 16-2 in the Z-axis direction and sandwiched between the accumulation region 16-2 and the accumulation region 16-3 in the Z-axis direction. The doping concentrations of the accumulation region 16-1, the accumulation region 16-2 and the accumulation region 16-3 may respectively be the same as the doping concentrations of the accumulation region 16-1, the accumulation region 16-2 and the accumulation region 16-3 in the semiconductor device 100 shown in FIG. 10.

The floating region 17 provided in contact with the dummy trench portion 30 is spaced apart, in the Y-axis direction, from the floating region 17 provided in contact with the gate trench portion 40. The floating region 17 provided in contact with the dummy trench portion 30 may be provided at substantially the same depth as the floating region 17 provided in contact with the gate trench portion 40.

In the semiconductor device 100 of the present example, a floating region 17 is provided in contact with a dummy trench portion 30, and a plurality of accumulation regions 16 are provided. Thus, when holes accumulated in the floating region 17 contacting the dummy trench portion 30 move toward the upper surface 21 in the vicinity of the dummy trench portion 30, they are easily accumulated in the accumulation regions 16, which are provided above the floating region 17. This can reduce the holes going out to the emitter electrode 52.

In the semiconductor device 100 of the present example, the floating region 17 provided in contact with the dummy trench portion 30 is spaced apart, in the Y-axis direction, from the floating region 17 provided in contact with the gate trench portion 40, and thus electron current flows in the vicinity of the center of the first mesa portion 60 at the depth of the floating regions 17, in like manner with the semiconductor device 100 shown in FIG. 12b. Thus, the rate of decrease in CE voltage (dVce/dt) can be reduced, in like manner with the semiconductor device 100 shown in FIG. 12b.

Figure 13A:
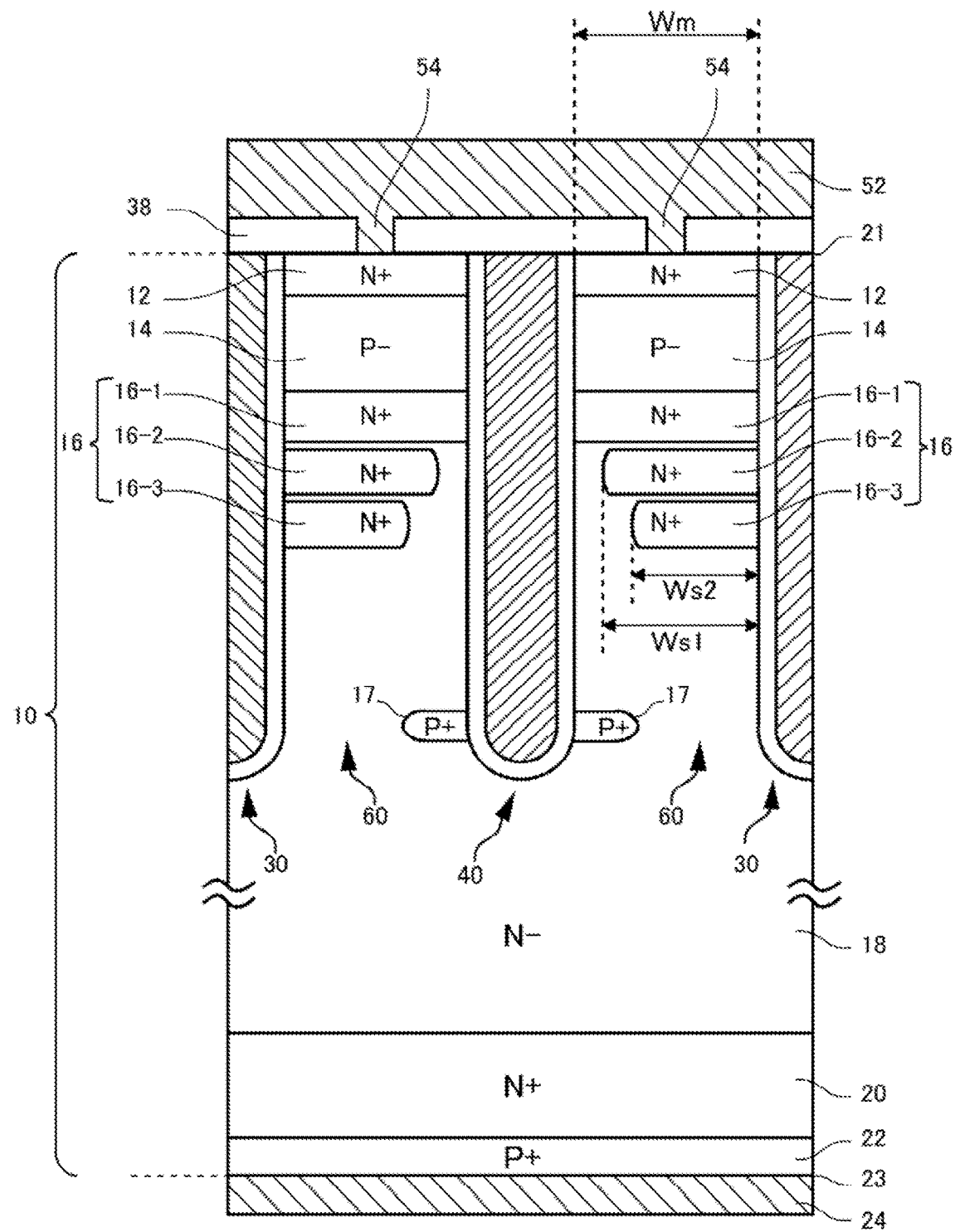
FIG. 13a shows another example of the cross section along b-b' in FIG. 1.

FIG. 13a shows another example of the cross section along b-b' in FIG. 1a. The semiconductor device 100 shown in FIG. 13a is different from the semiconductor device 100 shown in FIG. 10 in that, as compared with the semiconductor device 100 shown in FIG. 10, the second accumulation region 16-2 and the third accumulation region 16-3 are spaced apart from the gate trench portion 40. The drift region 18 may be provided in the respective regions sandwiched between the accumulation region 16-1 and the accumulation region 16-2 in the Z-axis direction and sandwiched between the accumulation region 16-2 and the accumulation region 16-3 in the Z-axis direction.

In the present example, width Ws1 is the Y-axis direction width of the second accumulation region 16-2, and width Ws2 is the Y-axis direction width of the third accumulation region 16-3. In the present example, width Ws1 and width Ws2 are both smaller than width Wm.

As described with reference to FIG. 2b, the second accumulation region 16-2 provided below the first accumulation region 16-1 allows electron current, when beginning to return to the gate trench portion 40 from the vicinity of the center of the first accumulation region 16-1, to easily flow in the vicinity of the center of the first mesa portion 60. Thus, as long as the second accumulation region 16-2 is provided in the vicinity of the center of the first mesa portion 60, even though not provided over the entire Y-axis direction length of the first mesa portion 60, the path of electron current can be formed in the vicinity of the center of the first mesa portion 60.

The third accumulation region 16-3 allows electron current, which easily flows in the vicinity of the center of the first mesa portion 60 by virtue of the second accumulation region 16-2, to further easily flow in the vicinity of the center of the first mesa portion 60. The electron current that begins to return to the gate trench portion 40 from the second accumulation region 16-2 is smaller than the electron current that begins to return to the gate trench portion 40 from the first accumulation region 16-1. Thus, width Ws2 may be smaller than width Ws1.

Width Ws1 and width Ws2 may be between 60% and 90%, inclusive, of width Wm. Width Ws2 may be smaller than or larger than width Ws1. FIG. 13a shows an example where width Ws2 is smaller than width Ws1.

The second accumulation region 16-2 and the third accumulation region 16-3 may be in contact with or spaced apart from the dummy trench portion 30. FIG. 13a shows an example where the second accumulation region 16-2 and the third accumulation region 16-3 are in contact with the dummy trench portion 30.

Figure 13B:
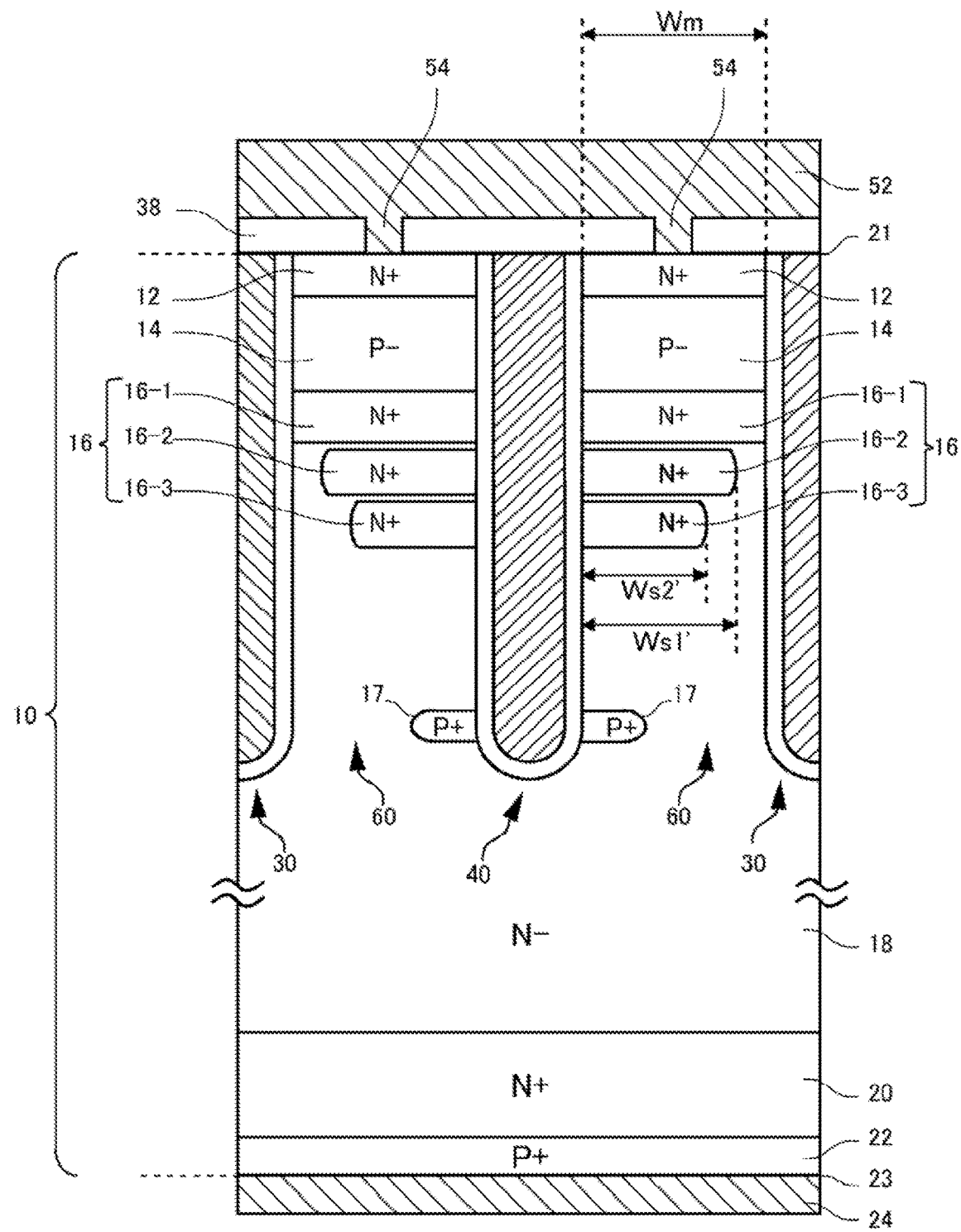
FIG. 13b shows another example of the cross section along b-b' in FIG. 1.

FIG. 13b shows another example of the cross section along b-b' in FIG. 1a. The semiconductor device 100 shown in FIG. 13b is different from the semiconductor device 100 shown in FIG. 10 in that, as compared with the semiconductor device 100 shown in FIG. 10, the second accumulation region 16-2 and the third accumulation region 16-3 are spaced apart from the dummy trench portion 30. The drift region 18 may be provided in the respective regions sandwiched between the accumulation region 16-1 and the accumulation region 16-2 in the Z-axis direction and sandwiched between the accumulation region 16-2 and the accumulation region 16-3 in the Z-axis direction.

In the present example, width Ws1' is the Y-axis direction width of the second accumulation region 16-2, and width Ws2' is the Y-axis direction width of the third accumulation region 16-3. In the present example, width Ws1' and width Ws2' are both smaller than width Wm.

As described with reference to FIG. 2b, in the semiconductor device 100 of the present example, electron current flows in the depth direction of the semiconductor substrate 10 in a region from the vicinity of the gate trench portion 40 to the vicinity of the center of the first mesa portion 60. Thus, the second accumulation region 16-2 and the third accumulation region 16-3 may be spaced apart from the dummy trench portion 30 as long as they are provided in the vicinity of the center of the first mesa portion 60.

Width Ws1' and width Ws2' may be between 60% and 90%, inclusive, of width Wm. Width Ws2' may be smaller than or larger than width Ws1'. FIG. 13a shows an example where width Ws2' is smaller than width Ws1'.

The second accumulation region 16-2 and the third accumulation region 16-3 may be in contact with or spaced apart from the gate trench portion 40. FIG. 13b shows an example where the second accumulation region 16-2 and the third accumulation region 16-3 are in contact with the gate trench portion 40.

Figure 14:
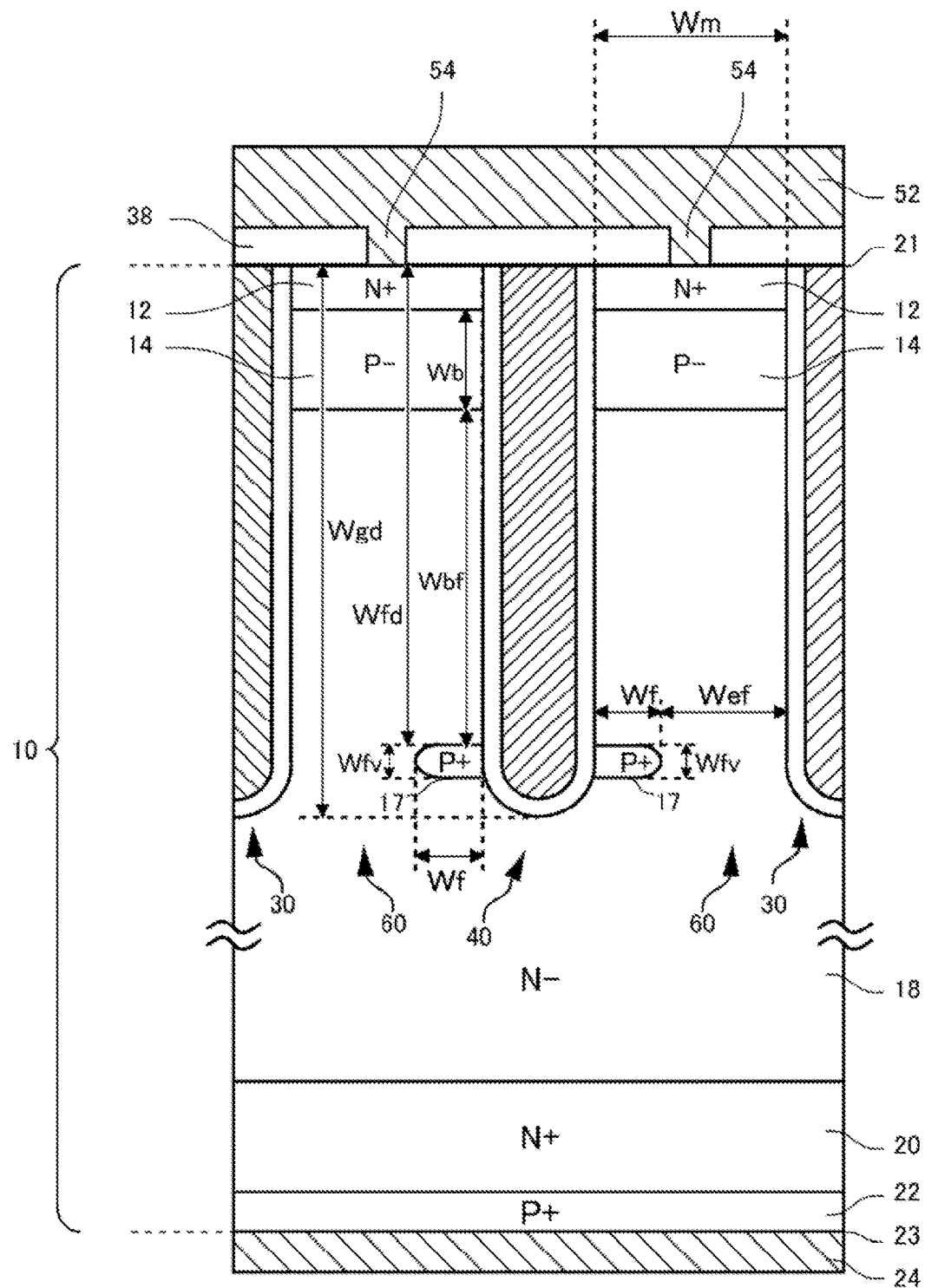
FIG. 14 shows another example of the cross section along b-b' in FIG. 1.

FIG. 14 shows another example of the cross section along b-b' in FIG. 1a. The semiconductor device 100 shown in FIG. 14 is different from the semiconductor device 100 shown in FIG. 5a in that, as compared with the semiconductor device 100 shown in FIG. 5a, no accumulation region 16 is provided. In the semiconductor device 100 the present example, width Wm, width Wf, width Wef, width Wgd, width Wfd, width Wb and width Wbf may be the same as those in the semiconductor device 100 shown in FIG. 5a.

In the semiconductor device 100 of the present example as well, width Wbf may be larger than width Wb. By making width Wbf larger than width Wb, when the transistor section 70 is in the ON state, a depletion layer expanding in the depth direction of the semiconductor substrate 10 from the junction interface between the base region 14 and the drift region 18 becomes less prone to reach the floating region 17. If the depletion layer reaches the floating region 17, electron current would be blocked. In the semiconductor device 100 of the present example, since width Wbf is larger than width Wb, electron current can flow in the vicinity of the center of the first mesa portion 60 without being blocked. Width Wbf may be twice or more width Wb. As an example, Width Wbf is 3 μm.

In the semiconductor device 100 of the present example, since no accumulation region 16 is provided, electron current continues to flow in the depth direction of the semiconductor substrate 10 in the vicinity of the gate trench portion 40 after passing through the channel in the base region 14 in the vicinity of the gate trench portion 40. As described with reference to FIG. 3, the electron current continuing to flow in the depth direction of the semiconductor substrate 10 in the vicinity of the gate trench portion 40 is bent in its path by the floating region 17 and follows a path of flowing from the vicinity of the gate trench portion 40 into the vicinity of the center of the first mesa portion 60.

As the electron current flows in the vicinity of the center of the first mesa portion 60, the hole distribution in the vicinity of the bottom portion of the first mesa portion 60 is divided at the vicinity of the center of the first mesa portion 60, so that the accumulation of holes at the lower end of the gate trench portion 40 is reduced. As a result, the displacement current can be reduced. In the semiconductor device 100 of the present example, due to the reduced displacement current, the charging of the gate conductive portion 44 is also reduced, and the momentary increase in gate voltage Vg is also reduced. This reduces the rate of decrease in CE voltage (dVce/dt).

Further, in the semiconductor device 100 of the present example, no accumulation region 16 is provided in contact with the gate trench portion 40. Thus, in the semiconductor device 100 of the present example, the increase in CG capacitance can be better prevented than in the semiconductor device 100 shown in FIG. 5a. That is, in the semiconductor device 100 of the present example, the increase in CG capacitance can be reduced while reducing the rate of decrease in CE voltage (dVce/dt). Thus, in the semiconductor device 100 of the present example, the turn-on loss can be reduced while reducing the rate of decrease in CE voltage (dVce/dt). Also, the trade-off between the ON voltage and the turn-off loss can be maintained.

Figure 15:
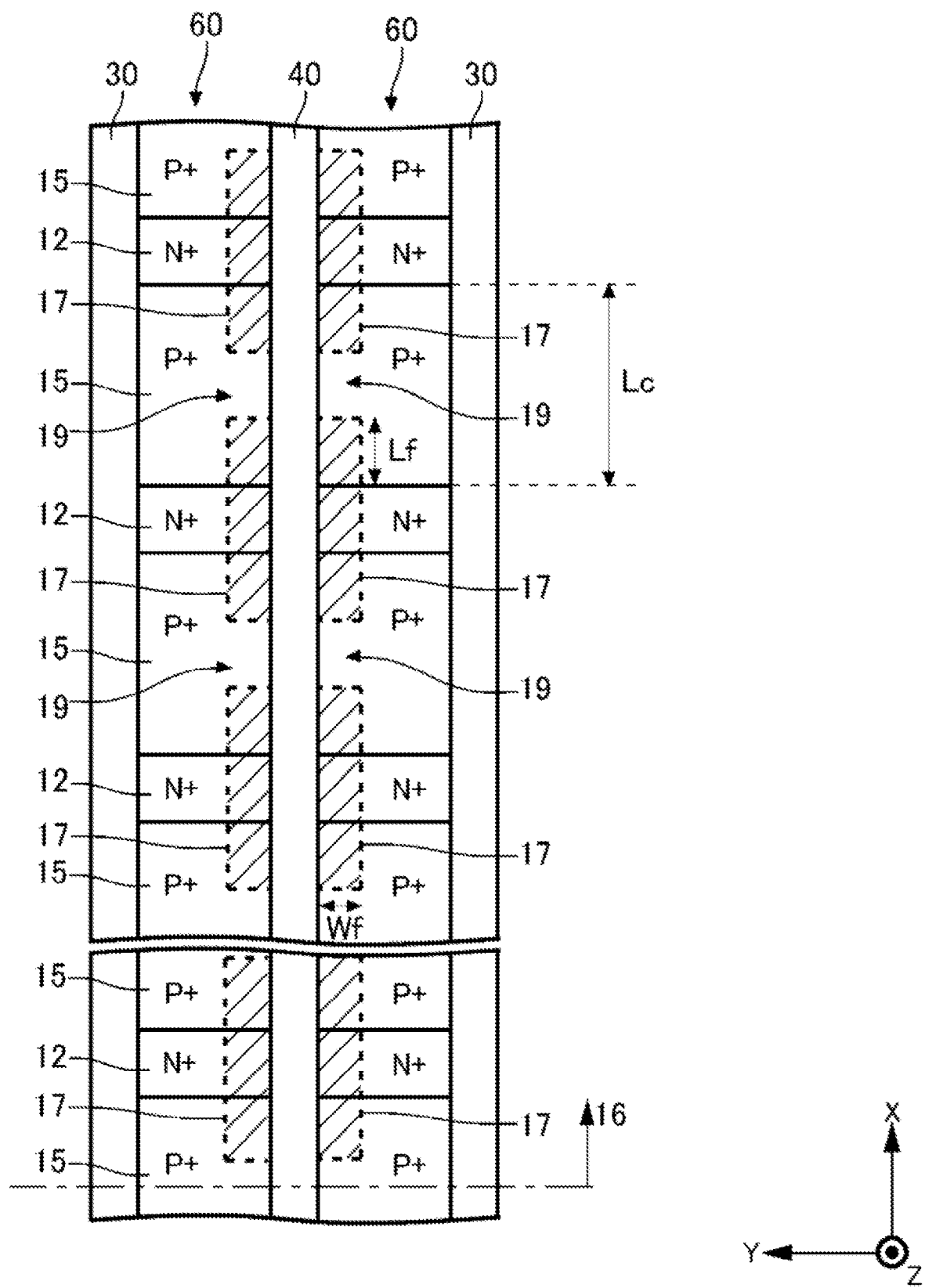
FIG. 15 shows another example of arrangement of floating regions 17 in first mesa portions 60.

FIG. 15 shows another example of arrangement of floating regions 17 in first mesa portions 60. FIG. 15 is a partial top view of first mesa portions 60. In FIG. 15, the regions in which the floating regions 17 are provided are hatched with oblique lines. Structures other than the floating regions 17 may be the same as those in the semiconductor device 100 of any of the aspects described with reference to FIG. 1a to FIG. 14. For example, while floating regions 17 are provided for a gate trench portion 40 but not provided for a dummy trench portion 30 in FIG. 15, floating regions 17 similar to those of the gate trench portion 40 may be provided for the dummy trench portion 30.

In the present example, the floating regions 17 are discretely arranged along the extending direction of the gate trench portion 40 (X-axis direction). That is, a plurality of floating regions 17 are arranged at intervals in the X-axis direction. Width Wf, the Y-axis direction width of the floating region 17, is the same as that of the floating region 17 of any of the aspects described with reference to FIG. 1a to FIG. 14.

Each floating region 17 may be provided over a larger portion in the X-axis direction than the emitter region 12. That is, each floating region 17 may be arranged to cover the entire portion of the emitter region 12 in the X-axis direction. In this case, the X-axis-direction ends of the floating region 17 are arranged at positions overlapping with contact regions 15. The region sandwiched between two floating regions 17 in the X-axis direction is referred to as a gap 19. The entire gap 19 may overlap with a contact region 15. The floating regions 17 may not be formed below the contact region 15. In particular, in the region below the center of the contact region 15 along the extending direction, the gap 19 is arranged and the floating regions 17 are not formed.

The X-axis direction length of each contact region 15 is referred to as Lc. In the X-axis direction, the length by which one floating region 17 overlaps with one contact region 15, Lf, is smaller than half of length Lc of the contact region 15. Length Lf may be ⅓ or less of length Lc.

Figure 16:
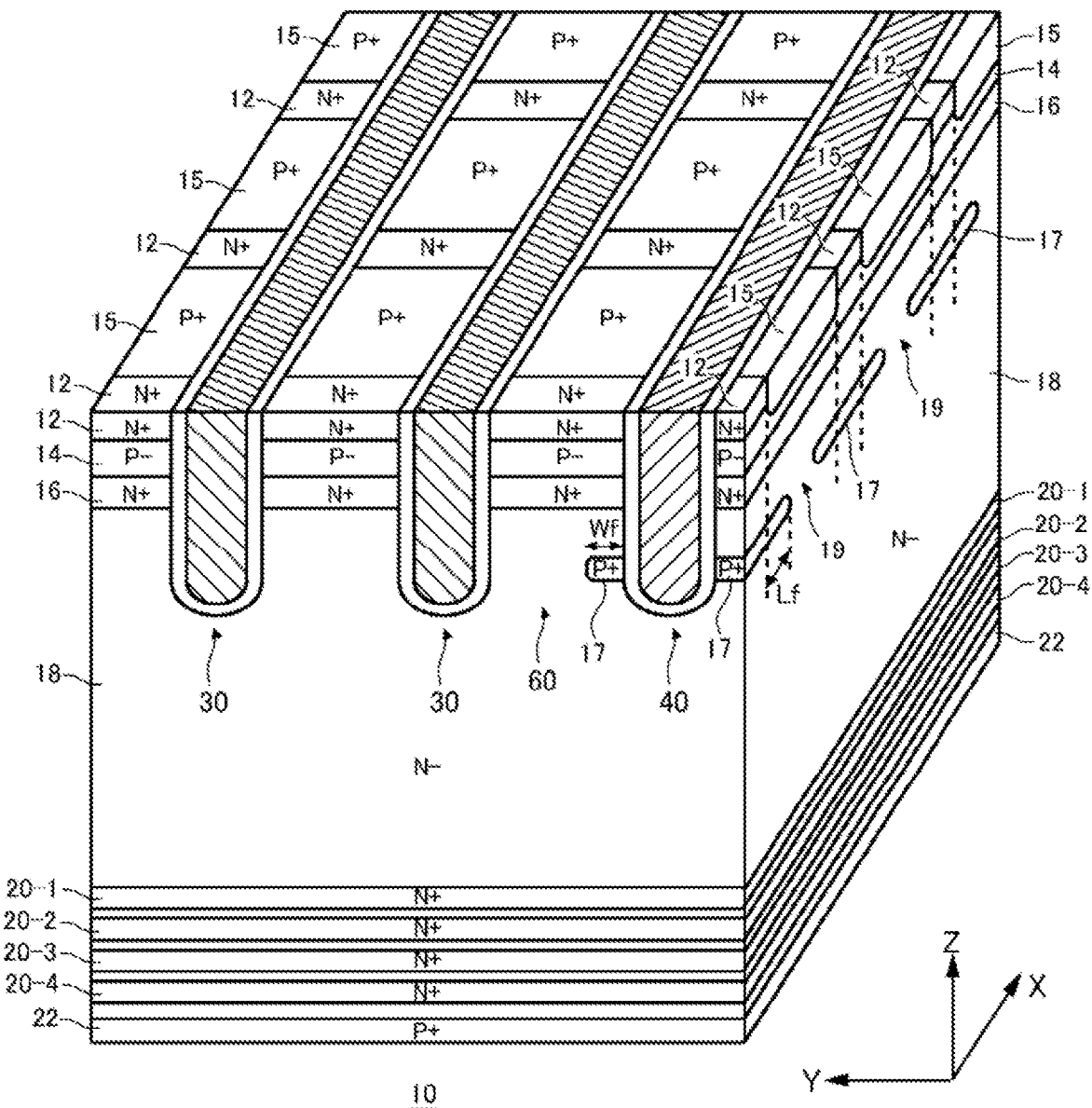
FIG. 16 is a partial perspective cross-sectional view of a semiconductor substrate 10.

FIG. 16 is a partial perspective cross-sectional view of the semiconductor substrate 10. FIG. 16 shows the respective surfaces of a Y-Z plane passing through emitter regions 12, a X-Z plane passing through the Y-axis direction center of a first mesa portion 60 in direct contact with a gate trench portion 40, and the upper surface 21 of the semiconductor substrate 10.

In the X-Z plane, regions overlapping with the emitter regions 12 are indicated by dashed lines. Each floating region 17 is arranged to overlap with the entire portion of an emitter region 12 and portions of contact regions 15 in the X-axis direction. By selectively arranging floating regions 17 to cover emitter regions 12, the increase in ON voltage Von can be reduced, and the rate of decrease in CE voltage (dVce/dt) can be reduced. Also, the trade-off between ON voltage Von and the turn-off loss can be maintained.

In the X-axis direction, the length by which a floating region 17 overlaps with a contact region 15, Lf, may be smaller than the Y-axis direction width of the floating region 17, Wf. Length Lf may be the same as width Wf, or may be larger than width Wf.

The electro-static potential distribution in the vicinity of the floating region 17 is such that holes are easily concentrated at the floating region 17. Thus, if a floating region 17 is provided below a contact region 15, holes are easily dispersed to the contact region 15 via the floating region 17. This may reduce the IE effect and increase ON voltage Von. Not forming floating regions 17 below contact regions 15, as in the present example, allows holes to be easily concentrated at the emitter regions 12, so that the IE effect can be maintained and the increase in ON voltage Von can be reduced.

Note that the semiconductor device 100 of the present example includes a plurality of buffer regions 20 arranged along the Z-axis direction. The doping concentration distribution in the Z-axis direction has a peak in each buffer region 20. The doping concentration distribution in the Z-axis direction may have valleys arranged between the individual buffer regions 20. The structure of the buffer regions 20 may be similar to that in the examples described with reference to FIG. 1a to FIG. 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 13: floating region end, 14: base region, 15: contact region, 16: accumulation region, 16-1: first accumulation region, 16-2: second accumulation region, 16-3: third accumulation region, 17: floating region, 18: drift region, 19: gap, 20: buffer region, 21: upper surface, 22: collector region, 23: lower surface, 24: collector electrode, 25: connecting portion, 29: extending portion, 30: dummy trench portion, 31: connecting portion, 32: dummy insulating film, 34: dummy conductive portion, 38: interlayer dielectric film, 39: extending portion, 40: gate trench portion, 41: connecting portion, 42: gate insulating film, 43: side wall, 44: gate conductive portion, 48: gate runner, 49: contact hole, 50: gate metal layer, 52: emitter electrode, 54: contact hole, 56: contact hole, 60: first mesa portion, 62: second mesa portion, 64: third mesa portion, 70: transistor section, 80: diode section, 82: cathode region, 87: high hole concentration region, 89: bottom portion, 90: boundary section, 100: semiconductor device, 150: semiconductor device, 160: semiconductor device

What is claimed is:

1. A semiconductor device comprising:
   a semiconductor substrate;
   a first-conductivity-type drift region provided in the semiconductor substrate;
   a gate trench portion provided from an upper surface of the semiconductor substrate to an inside of the semiconductor substrate, and extending in a predetermined extending direction in a plane of the upper surface of the semiconductor substrate;
   a mesa portion provided in contact with the gate trench portion in an array direction orthogonal to the extending direction;
   a second-conductivity-type base region provided in the mesa portion above the drift region and in contact with the gate trench portion; and
   a second-conductivity-type floating region provided in the mesa portion below the base region and in contact with the gate trench portion, and provided in a part of the mesa portion in the array direction, wherein
   the doping concentration of the floating region is higher than the doping concentration of the base region.

2. The semiconductor device according to claim 1, wherein the floating region is spaced apart from the accumulation regions in a depth direction of the semiconductor substrate.

3. The semiconductor device according to claim 2, wherein at least a part of the floating region in the depth direction of the semiconductor substrate is provided in contact with a bottom portion of the gate trench portion.

4. The semiconductor device according to claim 3, comprising a plurality of the accumulation regions arranged along a depth direction of the semiconductor substrate.

5. The semiconductor device according to claim 4, wherein one of the plurality of accumulation regions that is provided at a lowest position has a lower doping concentration than one of the plurality of accumulation regions that is provided at an uppermost position.

6. The semiconductor device according to claim 1, wherein a distance between the base region and the floating region in a depth direction of the semiconductor substrate is larger than a width of the base region in the depth direction of the semiconductor substrate.

7. The semiconductor device according to claim 1, wherein a width of the floating region in the array direction is between 0.1 times and 0.5 times, inclusive, of a width of the mesa portion in the array direction.

8. The semiconductor device according to claim 1, wherein
   the drift region is provided in a region of the mesa portion in direct contact with the floating region in the array direction, and
   a width of the floating region in the array direction is smaller than a width of the drift region in the array direction at a depth at which the floating region is provided.

9. The semiconductor device according to claim 1, wherein the floating region has a higher doping concentration than the accumulation regions.

10. The semiconductor device according to claim 9, wherein the doping concentration of the floating region is $1\times10^{19}/cm^3$ or more.

11. The semiconductor device according to claim 10, further comprising:
a dummy trench portion provided from the upper surface of the semiconductor substrate to an inside of the semiconductor substrate, extending in the extending direction in the plane of the upper surface of the semiconductor substrate, and sandwiching the mesa portion with the gate trench portion; and
a second-conductivity-type floating region provided in the mesa portion below the accumulation regions and in contact with the dummy trench portion, and provided in a part of the mesa portion in the array direction, wherein
the floating region contacting the gate trench portion and the floating region contacting the dummy trench portion are spaced apart in the array direction.

12. The semiconductor device according to claim 1, wherein a transistor section including the gate trench portion and a diode section are provided in the semiconductor substrate, wherein
the diode section comprises:
the drift region;
a dummy trench portion provided from the upper surface of the semiconductor substrate to an inside of the semiconductor substrate, and extending in the extending direction;
a mesa portion provided in contact with the dummy trench portion in the array direction; and
the base region provided in the mesa portion above the drift region and in contact with the dummy trench portion, and
no floating region is provided for the dummy trench portion provided in the diode section.

13. A semiconductor device comprising:
a semiconductor substrate:
a first-conductivity-type drift region provided in the semiconductor substrate;
a gate trench portion provided from an upper surface of the semiconductor substrate to an inside of the semiconductor substrate, and extending in a predetermined extending direction in a plane of the upper surface of the semiconductor substrate;
a mesa portion provided in contact with the gate trench portion in an array direction orthogonal to the extending direction;
one or more first-conductivity-type accumulation regions provided in the mesa portion above the drift region and in contact with the gate trench portion, and having a higher doping concentration than the drift region;
a second-conductivity-type base region provided in the mesa portion above the accumulation regions and in contact with the gate trench portion; and
a second-conductivity-type floating region provided in the mesa portion below the accumulation regions and in contact with the gate trench portion, and provided in a part of the mesa portion in the array direction, wherein
a transistor section including the gate trench portion and a boundary section included in the transistor section are provided in the semiconductor substrate, wherein
the boundary section comprises:
the drift region;
a dummy trench portion provided from the upper surface of the semiconductor substrate to an inside of the semiconductor substrate, and extending in the extending direction;
a mesa portion provided in contact with the dummy trench portion in the array direction; and
the base region provided in the mesa portion above the drift region and in contact with the dummy trench portion, and
no floating region is provided for the dummy trench portion provided in the boundary section.

14. The semiconductor device according to claim 1, wherein a plurality of the floating regions are discretely arranged along the extending direction of the gate trench portion.

15. The semiconductor device according to claim 14, wherein
an first-conductivity-type emitter region having a higher doping concentration than the drift region and a second-conductivity-type contact region are alternately arranged along the extending direction in a plane of an upper surface of the mesa portion contacting the gate trench portion, and
each of the floating regions is provided over a larger area in the extending direction than the emitter region.

16. A semiconductor device comprising:
a semiconductor substrate;
a first-conductivity-type drift region provided in the semiconductor substrate;
a gate trench portion provided from an upper surface of the semiconductor substrate to an inside of the semiconductor substrate, and extending in a predetermined extending direction in a plane of the upper surface of the semiconductor substrate;
a mesa portion provided in contact with the gate trench portion in an array direction orthogonal to the extending direction;
a second-conductivity-type base region provided in the mesa portion above the drift region and in contact with the gate trench portion; and
a second-conductivity-type floating region provided in the mesa portion below the base region and in contact with the gate trench portion, and provided in a part of the mesa portion in the array direction, wherein
a distance between the base region and the floating region in a depth direction of the semiconductor substrate is larger than a width of the base region in the depth direction of the semiconductor substrate.

17. The semiconductor device according to claim 1, further comprising
one or more first-conductivity-type accumulation regions provided in the mesa portion above the drift region and in contact with the gate trench portion, and having a higher doping concentration than the drift region, wherein
the second-conductivity-type base region is provided in the mesa portion above the accumulation regions.

* * * * *